United States Patent
Yada

(10) Patent No.: US 8,926,785 B2
(45) Date of Patent: Jan. 6, 2015

(54) MULTI-PIECE BOARD AND METHOD FOR MANUFACTURING THE SAME

(75) Inventor: Takahiro Yada, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 13/523,935

(22) Filed: Jun. 15, 2012

(65) Prior Publication Data

US 2012/0247662 A1     Oct. 4, 2012

Related U.S. Application Data

(62) Division of application No. 12/696,404, filed on Jan. 29, 2010.

(60) Provisional application No. 61/184,159, filed on Jun. 4, 2009.

(51) Int. Cl.
 B29C 65/00 (2006.01)
 B32B 37/00 (2006.01)
 H05K 3/00 (2006.01)
 H05K 1/02 (2006.01)

(52) U.S. Cl.
 CPC ............ *H05K 3/0097* (2013.01); *H05K 1/0269* (2013.01); *H05K 3/0052* (2013.01); *H05K 2201/09036* (2013.01); *H05K 2201/09063* (2013.01); *H05K 2201/09145* (2013.01); *H05K 2201/09154* (2013.01); *H05K 2201/09781* (2013.01); *H05K 2201/09918* (2013.01); *H05K 2201/10598* (2013.01); *H05K 2203/0169* (2013.01); *H05K 2203/166* (2013.01); *H05K 2203/167* (2013.01)
 USPC ........... 156/293; 156/290; 156/305; 361/752; 361/784; 29/825; 29/830

(58) Field of Classification Search
 USPC ............. 156/91, 92, 305, 247, 701, 716, 290, 156/293–295, 297, 298; 361/779, 784, 792, 361/796, 803, 756, 749–752; 29/830, 29/402.8, 426.3, 739, 740, 825, 827, 829, 29/831; 174/254, 255, 262
 See application file for complete search history.

(56) References Cited

U.S. PATENT DOCUMENTS 6,727,591 B2 * 4/2004 Yanase et al. .................. 257/758
7,107,672 B2 * 9/2006 Onitsuka et al. ................ 29/832

FOREIGN PATENT DOCUMENTS

JP   10-247656   9/1998
JP   11-307905   11/1999

(Continued)

OTHER PUBLICATIONS

JP2007-115855 Machine Translation Feb. 18, 2013.*

*Primary Examiner* — John Goff
*Assistant Examiner* — Hannuri L Kwon
(74) *Attorney, Agent, or Firm* — Oblon, Spivak, McClelland, Maier & Neustadt, L.L.P.

(57) ABSTRACT

A method for manufacturing a multi-piece board having a frame section and a multiple piece sections connected to the frame section includes forming a frame section from a manufacturing panel for the frame section, sorting out multiple acceptable piece sections by inspecting quality of piece sections, forming notch portions in the frame section and the acceptable piece sections such that the notch portions allow the acceptable piece sections to be arranged with respect to the frame section, provisionally fixing the piece sections and the frame section in respective positions, injecting an adhesive agent into cavities formed by the notch portions when the frame section and the piece sections are provisionally fixed to each other, and joining the acceptable piece sections with the frame section by curing the adhesive agent injected into the cavities.

20 Claims, 29 Drawing Sheets

(56) References Cited

FOREIGN PATENT DOCUMENTS

| | | |
|---|---|---|
| JP | 2000-252605 | 9/2000 |
| JP | 2002-289986 | 10/2002 |
| JP | 2005-38953 | 2/2005 |
| JP | 2005-154572 | 6/2005 |
| JP | 2005-322878 | 11/2005 |
| JP | 2007-115855 | 5/2007 |

* cited by examiner

MULTI-PIECE BOARD AND METHOD FOR MANUFACTURING THE SAME

CROSS REFERENCE TO RELATED APPLICATIONS

The present application is a divisional of U.S. application Ser. No. 12/696,404, filed Jan. 29, 2010, which is based upon and claims the benefit of priority to U.S. Application No. 61/184,159, filed Jun. 4, 2009. The entire contents of these applications are incorporated herein by reference.

BACKGROUND OF THE INVENTION

1. Field of the Invention

The present invention is related to a method for manufacturing a multi-piece board having a frame section and multiple piece sections, and to a multi-piece board manufactured by such a method.

2. Discussion of the Background

For example, in Japanese Laid-Open Patent Application No. 2002-289986, a multi-piece board is described in which a frame section and piece sections are separately formed and are adhered together later. Also, in Japanese Laid-Open Patent Application No. 2005-154572, a method for fixing a printed wiring board using an adhesive sheet is described. In addition, in Japanese Laid-Open Patent Application No. 2005-322878, an assembly panel is described in which protruding portions are formed on the peripheries of unit boards to integrate the unit boards with a frame. The contents of Japanese Laid-Open Patent Publication Nos. 2002-289986, 2005-154572 and 2005-322878 are incorporated herein by reference in their entirety. In addition, the contents of Japanese Patent Application Nos. 2008-288261 and 2008-276169 are also incorporated herein by reference in their entirety in the present application.

SUMMARY OF THE INVENTION

According to one aspect of the present invention, a method for manufacturing a multi-piece board having a frame section and a multiple piece sections connected to the frame section includes forming a frame section from a manufacturing panel for the frame section, sorting out multiple acceptable piece sections by inspecting quality of piece sections, forming notch portions in the frame section and the acceptable piece sections such that the notch portions allow the acceptable piece sections to be arranged with respect to the frame section, provisionally fixing the piece sections and the frame section in respective positions, injecting an adhesive agent into cavities formed by the notch portions when the frame section and the piece sections are provisionally fixed to each other, and joining the acceptable piece sections with the frame section by curing the adhesive agent injected into the cavities.

According to another aspect of the present invention, a multi-piece board includes a frame section, multiple piece sections positioned with respect to the frame section, and multiple adhesive agent portions connecting the frame section and the piece sections. The frame section and/or the piece sections have notch portions which allow the piece sections to be arranged with respect to the frame section and form first clearance between the frame section and piece sections. The frame section and/or the piece sections have second clearances adjacent to the notch portion. The adhesive agent portions are filling cavities formed between the frame section and piece sections by the first clearances and the second clearances.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
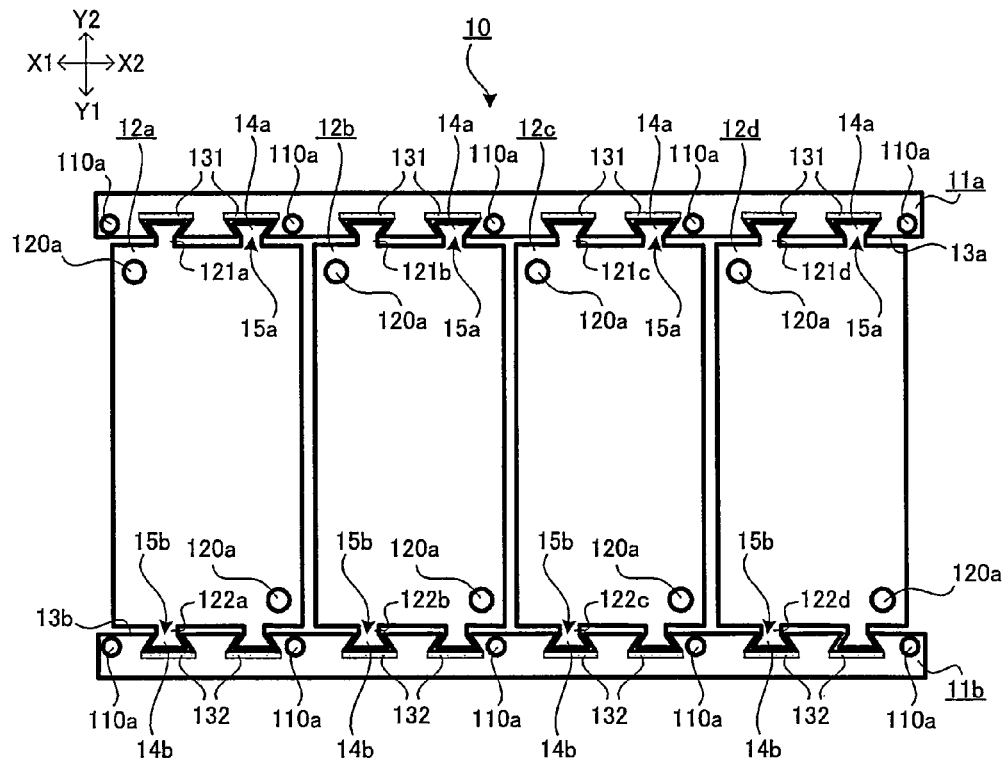
FIG. 1 is a plan view of a multi-piece board according to an embodiment of the present invention.

The embodiments will now be described with reference to the accompanying drawings, wherein like reference numerals designate corresponding or identical elements throughout the various drawings.

In the drawings, arrows (X1, X2, Y1, Y2, Z1, Z2) indicate six directions on three axes (XYZ axes) perpendicular to each other. Arrows (Z1, Z2) each indicate a direction in which layers are laminated in a wiring board, corresponding to the direction along a normal line (or the direction of the thickness of a core substrate) of a main surface (upper or lower surface) of the wiring board. In the following, in the lamination direction, a layer closer to a core substrate is referred to as a lower layer, and a layer farther from the core substrate is referred to as an upper layer. Meanwhile, the main surfaces of the wiring board are set on X-Y planes. Directions X correspond to the directions in which piece sections are positioned. Directions Y correspond to the directions in which frame sections and piece sections are joined.

Multi-piece board 10 of the present embodiment has frame sections (11a, 11b) and piece sections (12a, 12b, 12c, 12d) as shown in FIG. 1.

Frame sections (11a, 11b) are each made of, for example, a double-sided copper-clad laminate. However, they are not limited to such. For example, a wiring board formed by alternately laminating a predetermined number of conductive layers and insulation layers on a double-sided copper-clad laminate (core substrate) may also be used. In addition, a substrate formed by laminating and thermopressing multiple sheets of semi-cured base material, a so-called prepreg, may also be used. Frame sections (11a, 11b) are two long and narrow bars sandwiching a series of piece sections (12a-12d), for example. However, frame sections (11a, 11b) are not limited to such. Frame sections (11a, 11b) may be formed in any type. For example, they may be parallelogram, circular or elliptic frames, surrounding piece sections (12a-12d).

In each of frame sections (11a, 11b), multiple holes (110a) are formed keeping a predetermined distance. Such holes (110a) are used as alignment marks during the manufacturing process. Also, such holes are used to prevent shifting when router processing is conducted on the panel to separate it into units (piece sections 12a-12d).

Piece sections (12a-12d) are made of rectangular rigid wiring boards, for example. Such rigid wiring boards are, for example, six-layer wiring boards containing circuits for electronic components. However, piece sections (12a-12d) are not limited to rigid wiring boards, and may be made of flexible wiring boards or flex-rigid wiring boards. Also, they are not limited to multilayer boards, and double-sided wiring boards or single-sided wiring boards may be used. Moreover, the configuration and thickness of piece sections (12a-12d) are not limited specifically. For example, parallelogram, circular or elliptic configurations may also be employed. In addition, the number of layers may be smaller than six (such as one) or greater than six (such as eight). Such piece sections (12a-12d) are separated from frame sections (11a, 11b) and installed in a cell phone or the like, for example.

In each of piece sections (12a-12d), multiple alignment patterns (120a) are formed. Alignment patterns (120a) are made of copper pads formed by etching copper film, or gold pads formed by performing NiAu plating on such copper pads. Alignment patterns (120a) are positioned, for example, diagonally on piece sections (12a-12d). Such alignment patterns (120a) are used for alignment when manufacturing multi-piece board 10, for example. Instead of alignment patterns (120a), holes may also be used. Alignment patterns (120a) may be arranged in any position.

Piece section (12a) has bridges (121a, 122a); piece section (12b) has bridges (121b, 122b); piece section (12c) has bridges (121c, 122c); and piece section (12d) has bridges (121d, 122d). Bridges (121a-121d, 122a-122d) are formed, for example, at the four corners of piece sections (12a-12d).

Bridges (121a-121d) each have joint portion (14a) on their end; and bridges (122a-122d) each have joint portion (14b) on their end. Joint portions (14a, 14b) protrude from piece sections (12a-12d) in directions Y (the directions in which frame sections (11a, 11b) and piece sections (12a-12d) are joined). The planar shape of joint portions (14a, 14b) (protruding portions) is trapezoidal with its width increasing toward the end. On the other hand, frame sections (11a, 11b) have joint portions (15a, 15b) in positions respectively corresponding to joint portions (14a, 14b). Joint portions (15a, 15b) are recessed in frame sections (11a, 11b) in directions Y. The planar shape of joint portions (15a, 15b) (cavities) is trapezoidal corresponding to the trapezoidal planar shape of joint portions (14a, 14b). Joint portions (14a, 15a) function as joint members of frame section (11a) and piece sections (12a-12d); and joint portions (14b, 15b) function as joint members of frame section (11b) and piece sections (12a-12d). Joint portions (14a, 14b) and joint portions (15a, 15b) may be in any shape (for details, see FIGS. 40-42 described later).

Figure 2:
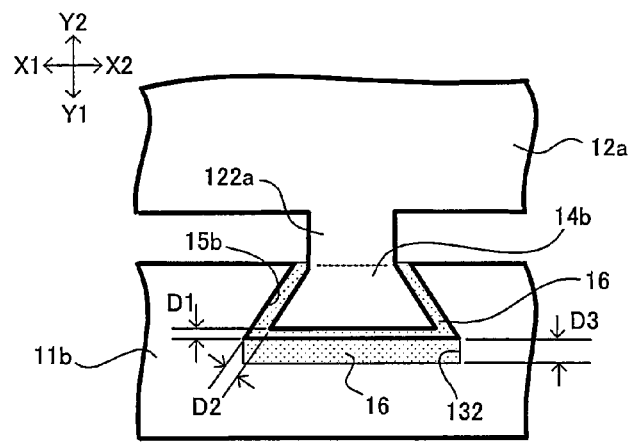
FIG. 2 is a magnified view showing part of FIG. 1.

In the present embodiment, joint portion (15b) of frame section (11b) and joint portion (14b) of piece section (12a) are arranged with predetermined clearances (D1, D2), as shown in FIG. 2 (partially magnified view of FIG. 1). Namely, clearances are formed between frame section (11b) and piece section (12a). In the drawing, clearance (D1) in joint portion (14b) on the arrow-Y1 side is approximately 0-150 μm, for example; it is especially preferred to be set between 30-100 μm. Also, the same as clearance (D1), clearance (D2) in joint portion (14b) on the arrow-X1 side or the arrow-X2 side is approximately 0-150 μm, for example; it is especially preferred to be set between 30-100 μm.

Figure 3:
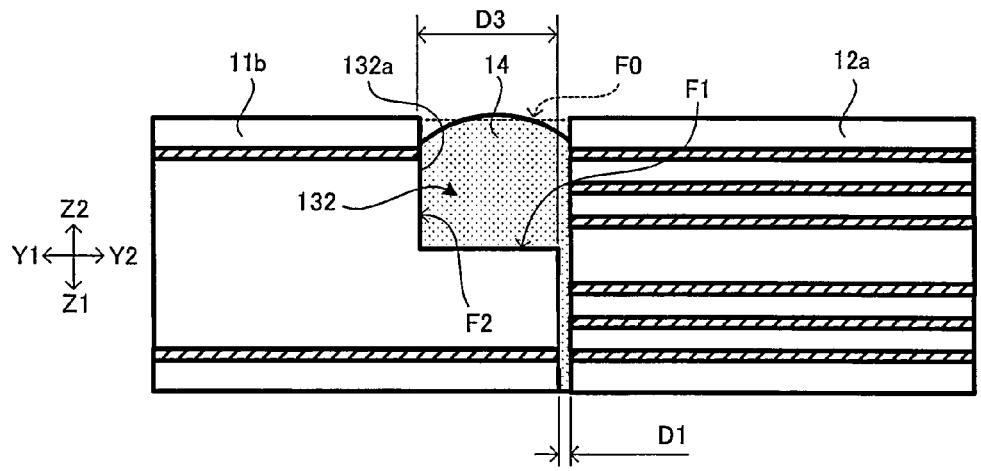
FIG. 3 is a cross-sectional view of FIG. 2.

Also, between frame section (11b) and piece section (12a) in the present embodiment, receptor 132 (cavity) is formed in order to have adhesive agent 16 injected. More specifically, as shown in FIG. 3 (cross-sectional view of FIG. 2), for example, notch portion (132a) is formed at an end of frame section (11b) (the end on the arrow-Y2 side). Notch portion (132a) has flat bottom surface (F1) (X-Y plane), and wall surface (F2) perpendicular to bottom (F1). Width (D3) of notch portion (132a) is set in the range of 350 mm. By arranging frame section (11b) and piece section (12a) to face each other by means of notch portion (132a), receptor 132 is formed between frame section (11b) and piece section (12a). Receptor 132 is a groove having opening surface (F0) on either the upper or lower surface (on the arrow-Z2 side) and it does not penetrate the main body of frame section (11b). The length (measurement in directions X) of receptor 132 corresponds to the bottom of the trapezoid of joint portion (15b). The width of receptor 132 (groove width=clearance D1+width D3) is preferred to be 400 μm-1 mm. The depth of receptor 132 depends on the board thickness of the base material, but it is preferred to be approximately 200 μm-600 μm.

In the present embodiment, a notch portion is not formed at the end of piece section (12a), and notch portion (132a) is formed only at the end of frame section (11b). In addition, between frame section (11b) and piece section (12a), adhesive 16 is filled in the first clearance (clearance D1) where notch portion (132a) is not formed, as well as in the second clearance (clearance D1 and width D3) which is enlarged by notch portion (132a). Then, as adhesive agent 16 is cured, frame section (11b) and piece section (12a) are joined.

Figure 4:
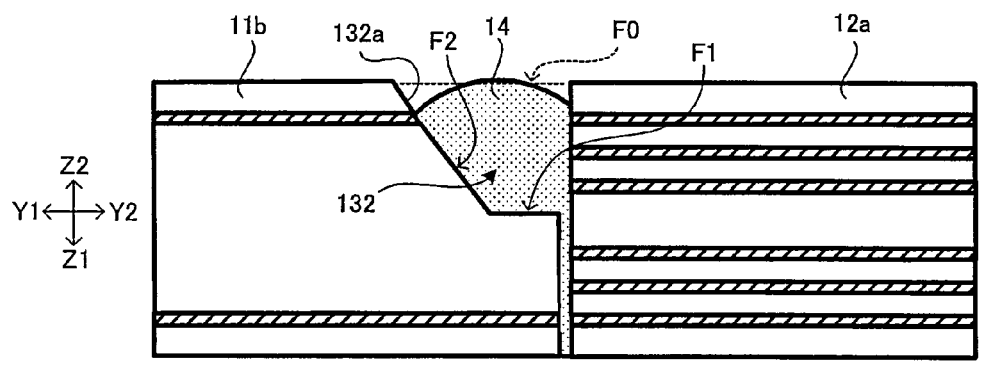
FIG. 4 is a view showing a first modified example of the cross-sectional shape of a receptor.
Figure 5:
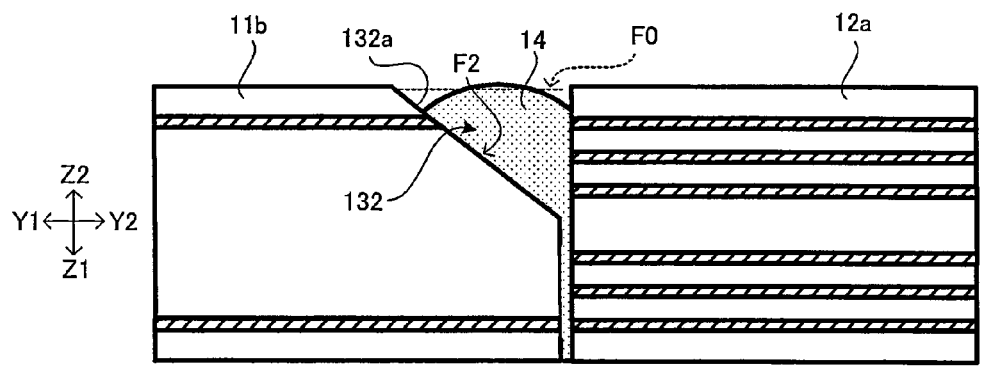
FIG. 5 is a view showing a second modified example of the cross-sectional shape of a receptor.

Receptor 132 may have any cross-sectional shape. As shown in FIG. 4 (a view corresponding to FIG. 3), receptor 132 may be a groove formed with notch portion (132a) having bottom surface (F1), and wall surface (F2) oblique to bottom surface (F1). Alternatively, as shown in FIG. 5 (a view corresponding to FIG. 3), receptor 132 may be a tapered groove formed with notch portion (132a) having only oblique wall surface (F2). By forming receptor 132 to be a tapered groove, the area adhered by adhesive agent 16 increases.

When adhesive agent 16 is injected into receptor 132, adhesive agent 16 flows into other clearances to fill each clearance. By filling and curing adhesive agent 16 between frame section (11b) and piece section (12a), frame section (11b) and piece section (12a) are joined and fixed (adhered) to each other.

Figure 6:
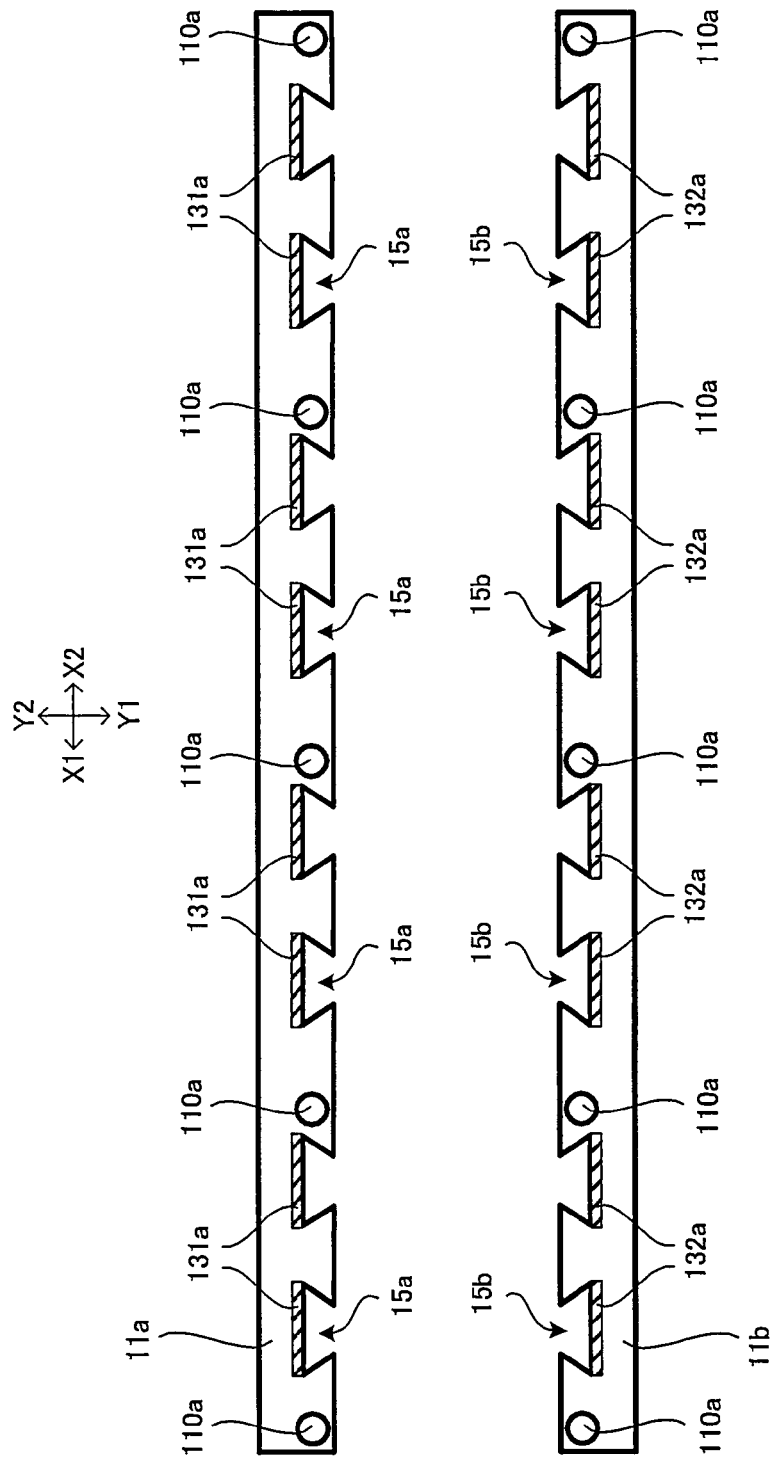
FIG. 6 is a plan view of frame sections according to the present embodiment.

FIG. 2 shows the structure on the side of frame section (11b) only. However, the structure on the side of frame section (11a) is the same. Also, the joint structures of piece sections (12b-12d) are the same as the joint structure of piece section (12a). Namely, as shown in FIG. 6, notch portion (131a) is formed in each joint portion (15a), and notch portion (132a) is formed in each joint portion (15b). Then, as shown in FIG. 1, receptors 131 are formed by notch portions (131a) between frame section (11a) and piece sections (12a-12d); and receptors 132 are formed by notch portions (132a) between frame section (11b) and piece sections (12a-12d).

As shown in FIG. 1, when frame section (11a) and piece sections (12a-12d) are joined, slit (13a) is formed between them except in bridges (121a-121d). Also, when frame section (11b) and piece sections (12a-12d) are joined, slit (13b) is formed between them except in bridges (122a-122d). Namely, frame section (11a) and piece sections (12a, 12b, 12c, 12d) are joined by bridges (121a, 121b, 121c, 121d) respectively. Also, frame section (11b) and piece sections (12a, 12b, 12c, 12d) are joined by bridges (122a, 122b, 122c, 122d) respectively.

Figure 7:
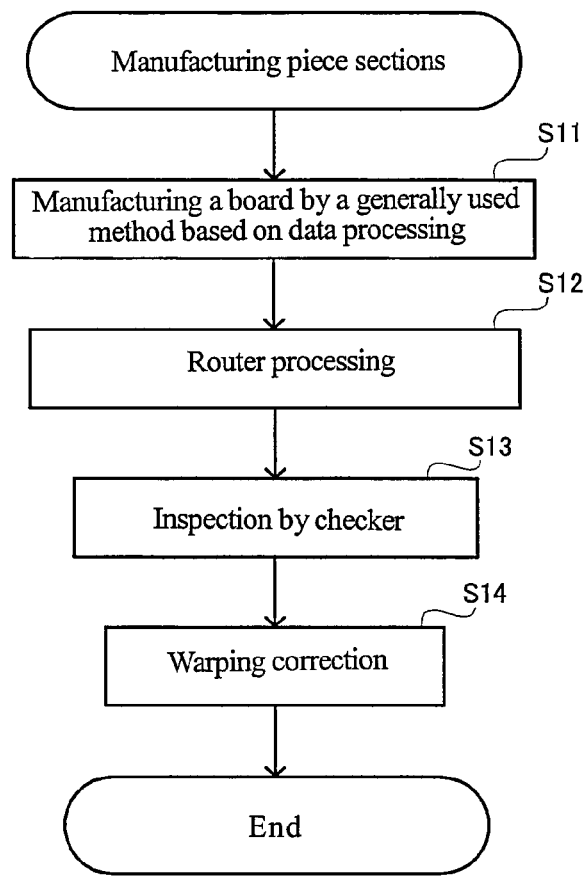
FIG. 7 is a flowchart showing a method for manufacturing a multi-piece board, especially the steps to form piece sections, according to the present embodiment.

In a method for manufacturing a multi-piece board according to the present embodiment, using the process shown in FIG. 7, piece sections (12a-12d) and their bridges (bridges 121a, 122a and others) are manufactured. In the present embodiment, since there is no difference in the structures (design data) of piece sections (12a-12d), common piece sections 12 and their bridges (121, 122) are manufactured first. Then, in the later process, they are formed into piece sections (12a-12d) and their bridges (bridges 121a, 122a and others).

First, panel 100 (first panel) is prepared in step (S11). Specifically, for example, by processing (data processing) according to the design data, a six-layer laminated wiring board (panel 100) is manufactured. Panel 100 may be manufactured, for example, by a generally used method for manufacturing a laminated wiring board. For example, panel 100 is manufactured by laminating prepreg made by impregnating a base material, for example, non-woven fabric such as glass cloth or aramid fabric, paper or the like with uncured epoxy resin, polyimide resin or phenol resin or the like. Other than such, a laminated board may also be formed by alternately laminating wiring layers and insulation layers on a ceramic base material, for example. The number of layers of panel 100 is not limited specifically.

Figure 8:
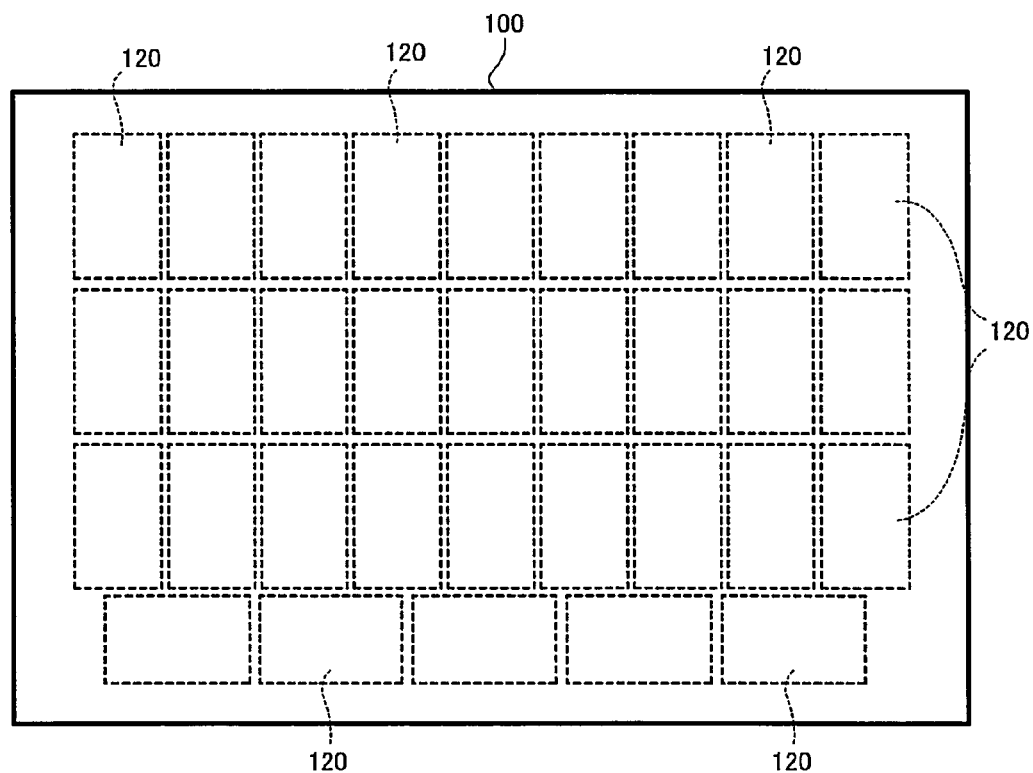
FIG. 8 is a view illustrating a step to prepare a first panel.

As shown in FIG. 8, a predetermined number of piece boards 120 is included in panel 100. Here, piece board 120 is a laminated board containing only one piece section 12 and its bridges (121, 122). By arranging each piece section 12 independently without joining multiple piece sections in panel 100, a piece section may be arranged in a small space, allowing a greater number of piece sections to be arranged in one panel. The shape of piece board 120 according to the present embodiment is rectangular (see FIG. 8). The external dimensions of such a rectangular board are set to be sufficient for the external dimensions (designed sizes) of piece section 12 and its bridges (121, 122).

In addition, NiAu plating or carbon printing on panel 100 may be performed.

Also, using X-rays or the like, holes (omitted from the drawing) are formed in panel 100 to secure the panel during router processing.

Figure 9:
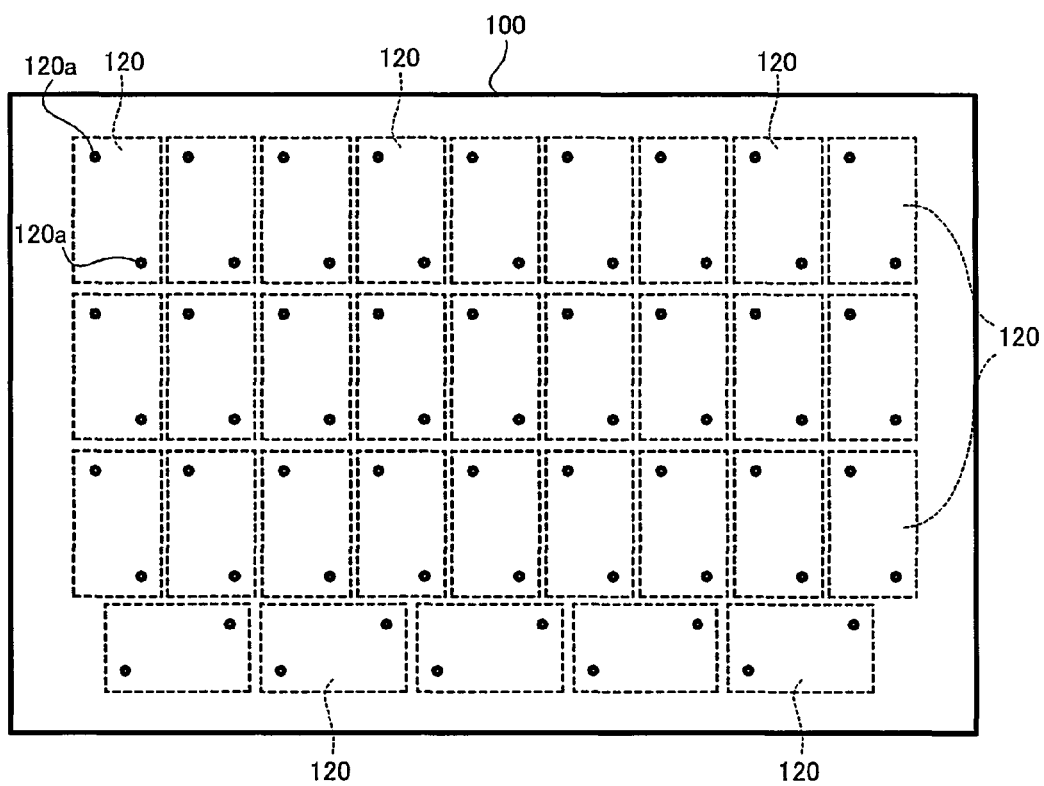
FIG. 9 is a view illustrating a step to form alignment patterns in piece sections.

Then, as shown in FIG. 9, alignment patterns (120a) are formed by etching copper, for example, or performing NiAu plating on copper. Alignment patterns (120a) are formed diagonally at two corners of piece section 12, for example. However, the positions are not limited to such. Alignment patterns (120a) may be positioned at four corners or at the center of piece section 12, although two diagonally set corners are preferred to be used to accurately determine positions with a smaller number of alignment patterns (120a).

Figure 10:
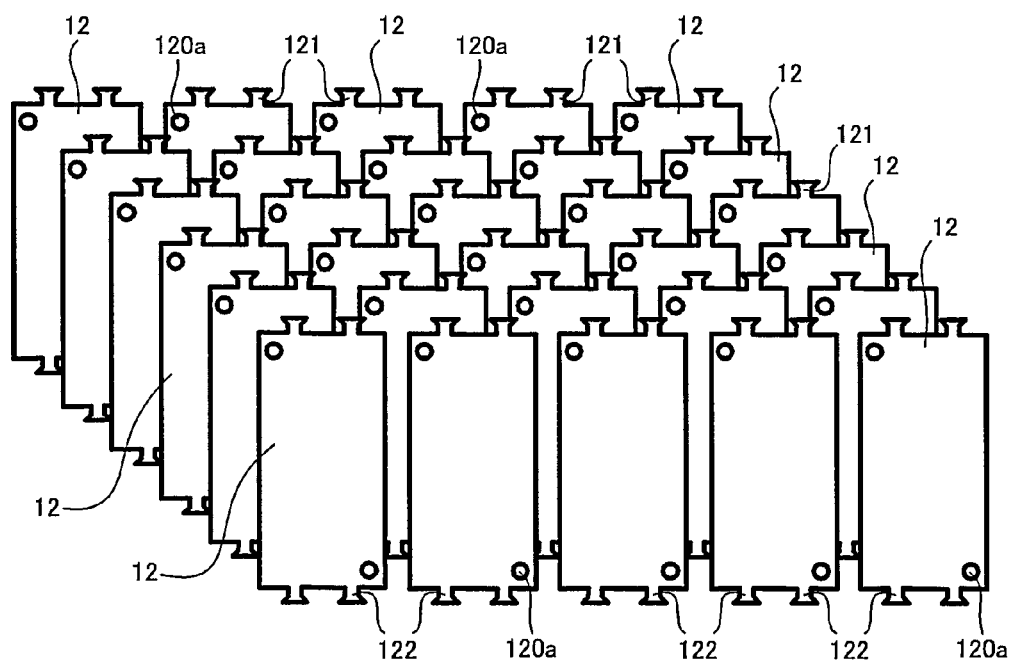
FIG. 10 is a view illustrating router processing.

Next, in step (S12) of FIG. 7, piece sections 12 and their bridges (121, 122) are cut to their designed sizes by router processing. As shown in FIG. 10, piece sections 12 and their bridges (121, 122) are obtained according to designed sizes. Piece sections 12 are each obtained as individual units. As for router processing, an alignment router (a router with alignment functions) with higher processing accuracy may be used rather than a regular router. However, a regular router is more effective than an alignment router in terms of processing speed.

Figure 11:
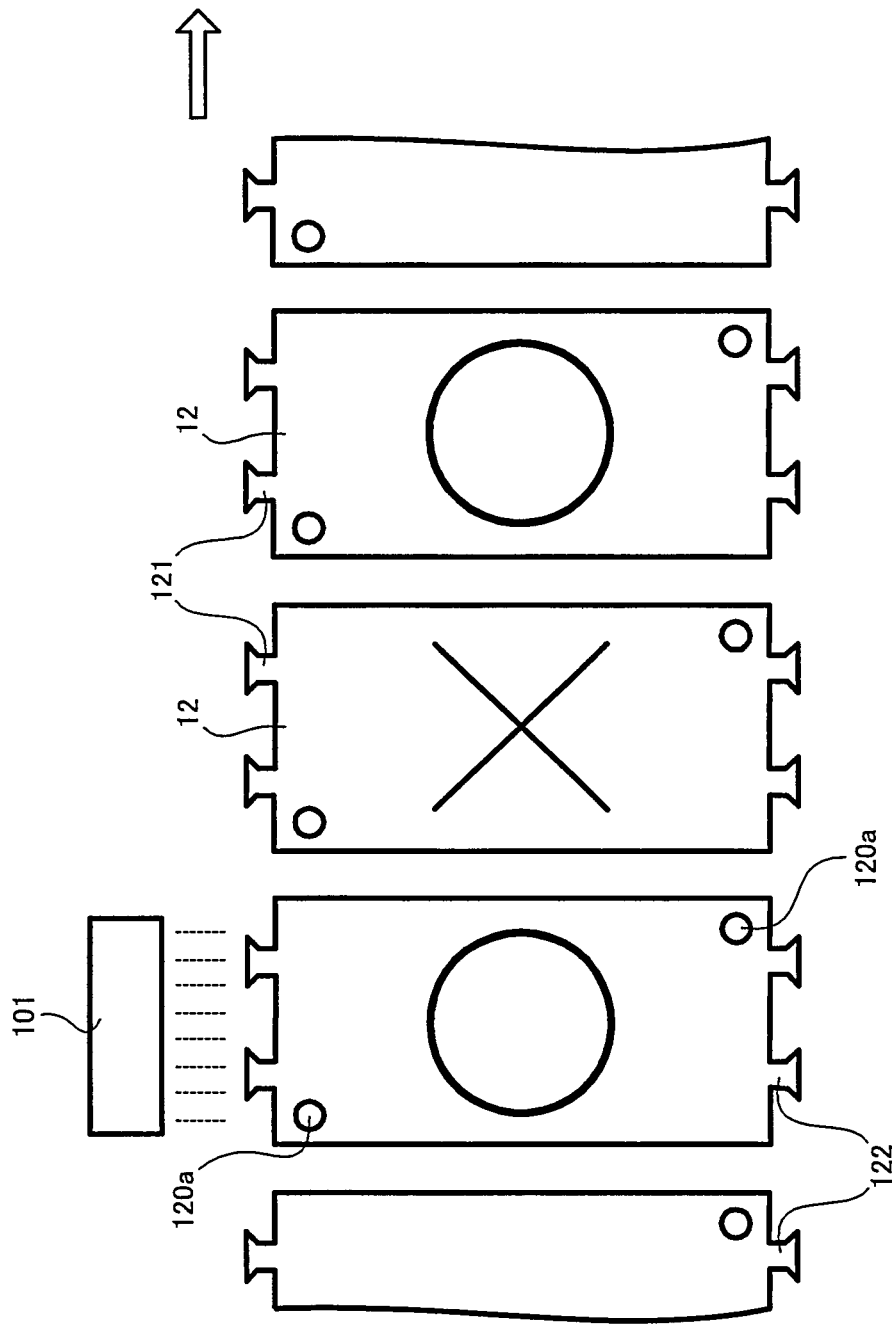
FIG. 11 is a view illustrating a step to inspect piece sections by a checker.
Figure 12:
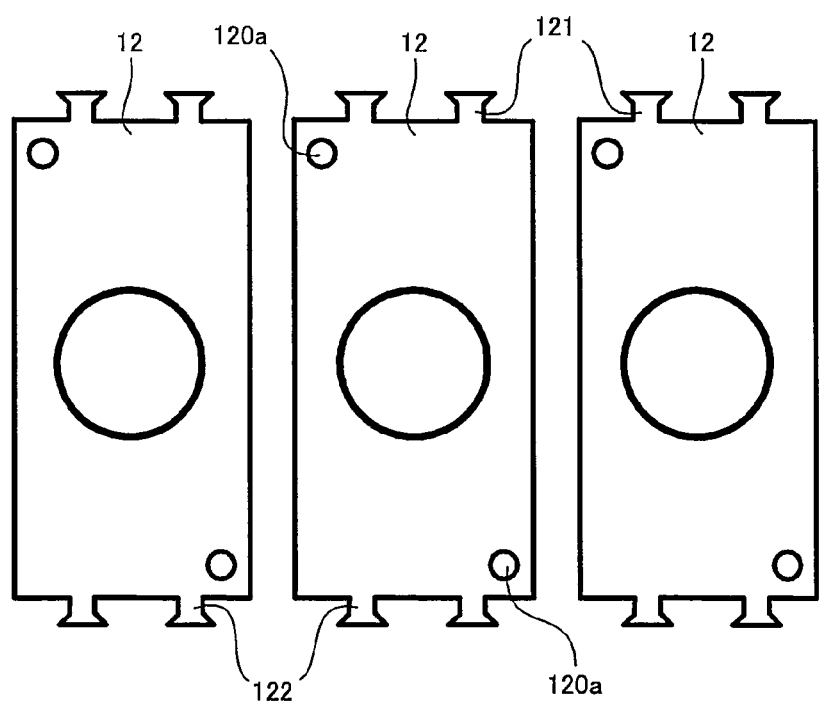
FIG. 12 is a view illustrating a step to sort good units and bad units among manufactured piece sections.

Then, in step (S13) of FIG. 7, predetermined inspections such as conductivity inspections are conducted on each piece section 12 using checker 101, for example, as shown in FIG. 11. For example, by automatically conveying piece sections 12, the quality of each unit is examined one by one. During such an inspection, piece sections are sorted into either acceptable (piece section 12 with "○" in the drawing) or defective (piece section 12 with "x" in the drawing) piece sections. Piece sections 12 determined to be defective are removed by hand or by an automatic device, for example. Accordingly, as shown in FIG. 12, only piece sections determined to be acceptable are obtained. By removing defective units at this stage, processes to separate a defective unit after the units are joined may be reduced.

Next, in step (S14) of FIG. 7, warping correction is conducted on each piece section 12. Such warping correction may be omitted unless necessary.

Figure 13:
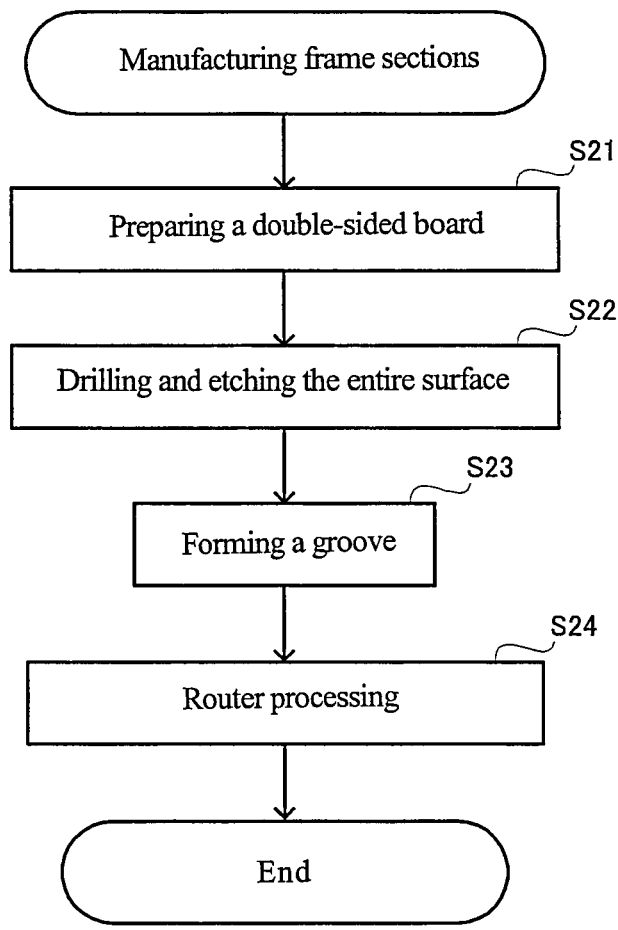
FIG. 13 is a flowchart showing a method for manufacturing a multi-piece board, especially the steps to form frame sections, according to the present embodiment.

In a method for manufacturing a multi-piece board according to the present embodiment, frame sections (11a, 11b) (FIG. 1) are manufactured using the procedures shown in FIG. 13. In the present embodiment, since the structures (design data) of frame sections (11a, 11b) are not different from each other, common frame sections 11 are manufactured first and will be formed into frame sections (11a, 11b) in the later process.

Figure 14:
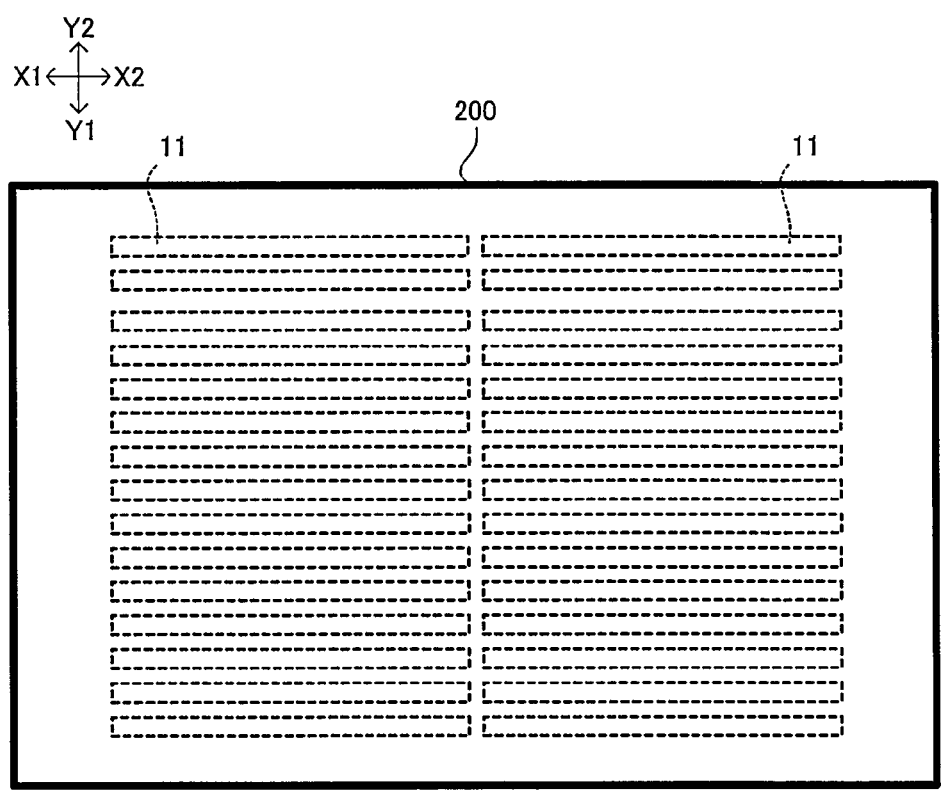
FIG. 14 is a view illustrating a step to prepare a second panel.

First, in step (S21), panel 200 (second panel) different from panel 100 (FIG. 8) is prepared. As for panel 200, a double-sided copper-clad laminate (double-sided board) is prepared, for example. As shown in FIG. 14, a predetermined number of frame sections 11 are included in panel 200.

Panel 200 is not limited to a double-sided copper-clad laminate. For example, panel 200 may be a wiring board formed by alternately laminating a predetermined number of conductive layers and insulation layers on a double-sided copper-clad laminate (core substrate). However, if a double-sided copper-clad laminate is used, panel 200 may be prepared at a lower cost.

Figure 15:
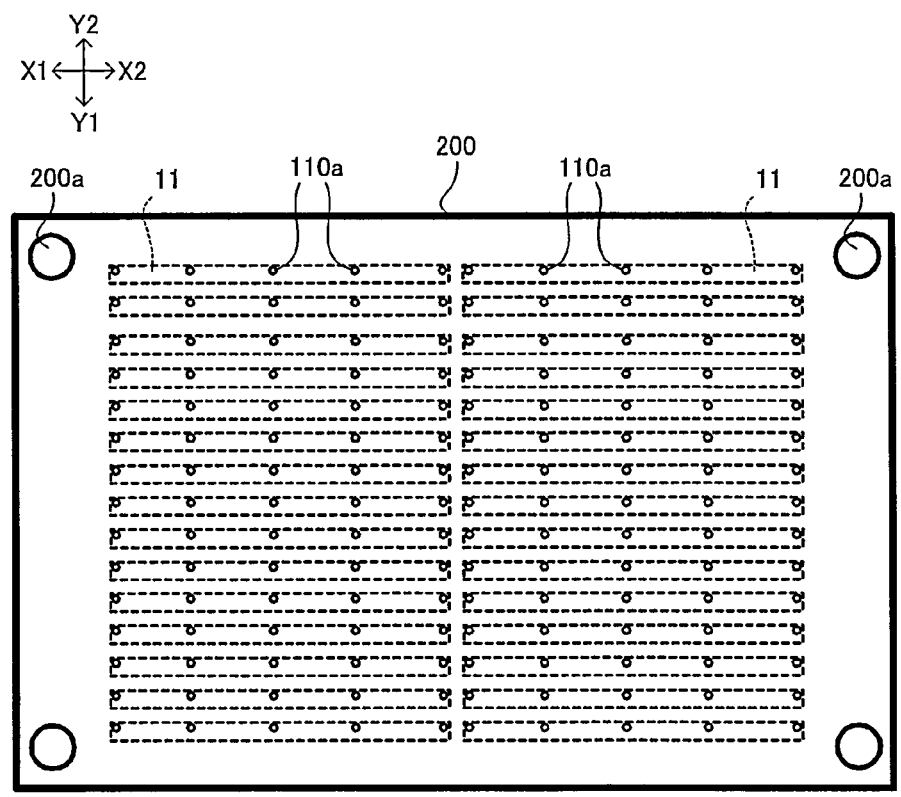
FIG. 15 is a view illustrating a step to form through-holes for alignment in frame sections.

Next, in step (S22) of FIG. 13, through-holes (base holes (200a) and holes (110a)) are formed using alignment drilling equipment, for example, as shown in FIG. 15. Base holes (200a) and holes (110a) are used for alignment or the like. Base holes (200a) are formed at four corners of panel 200, for example. However, the positions are not limited to such. Base holes (200a) may be positioned diagonally on panel 200. Also, holes (110a) on frame sections 11 are formed in positions corresponding to spots between piece sections (12a-12d) (FIG. 1). However, the positions are not limited to such. Holes (110a) may also be positioned only at both ends of frame sections 11.

After that, the entire surface of panel 200 is etched to remove copper foil. However, if the stability of copper foil is ensured by anti-corrosion treatment or protective solder resist, the copper foil may remain to enhance strength.

Figure 16:
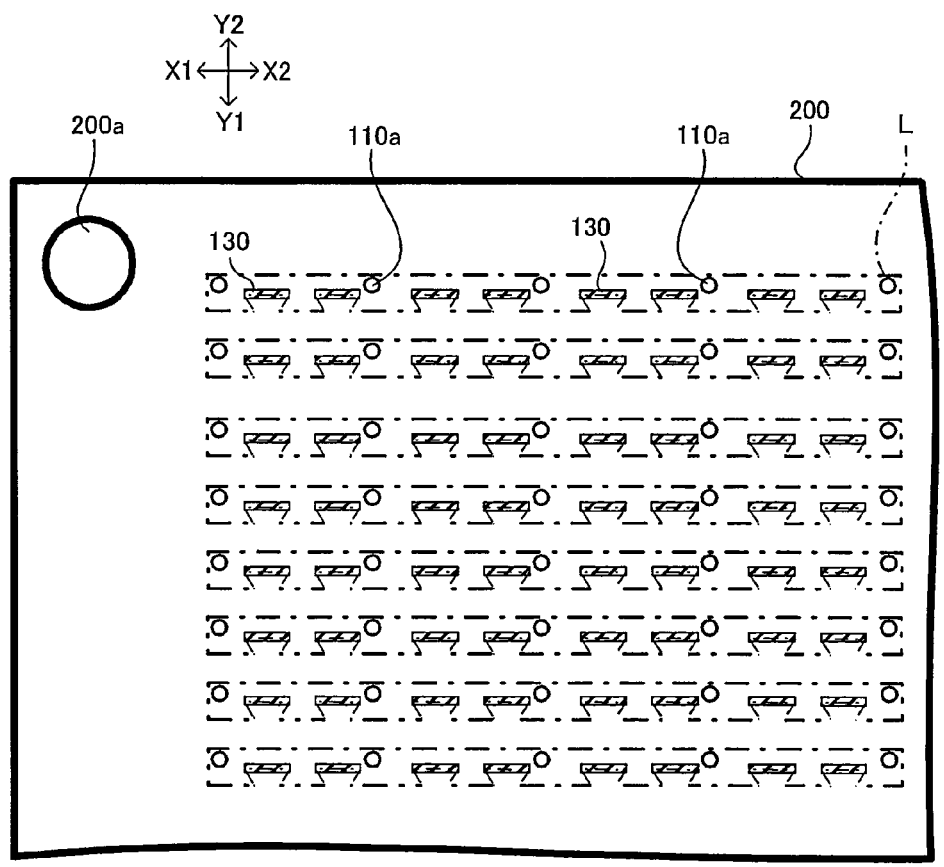
FIG. 16 is a magnified view showing part of FIG. 15.

Next, in step (S23) of FIG. 13, grooves 130 are formed in predetermined portions of frame sections 11 as shown in FIG. 16 (a partially magnified view of FIG. 15) by digging down to a predetermined depth using a router bit, for example, without penetrating the panel. The width of groove 130 is set greater than width (D3) of notch portion (132a) (FIG. 2). The method for processing frame sections 11 to form grooves 130 is not limited to router processing. Drilling or laser processing may also be employed. When forming tapered grooves as shown in FIG. 5, a so-called V-groove cutting tool is effective (see FIG. 28). Furthermore, chemical methods such as etching may be used depending on the material of frame sections 11.

Then, in step (S24) of FIG. 13, a router is used to cut the panel along cutout lines (L) (FIG. 16) corresponding to the designed size of frame sections 11 and obtains frame sections 11 (frame sections (11a) or (11b)) according to the designed size as shown in FIG. 2. In doing so, grooves 130 are severed, and notch portions (132a) with width (D3) (FIG. 2) may also be obtained.

Figure 17:
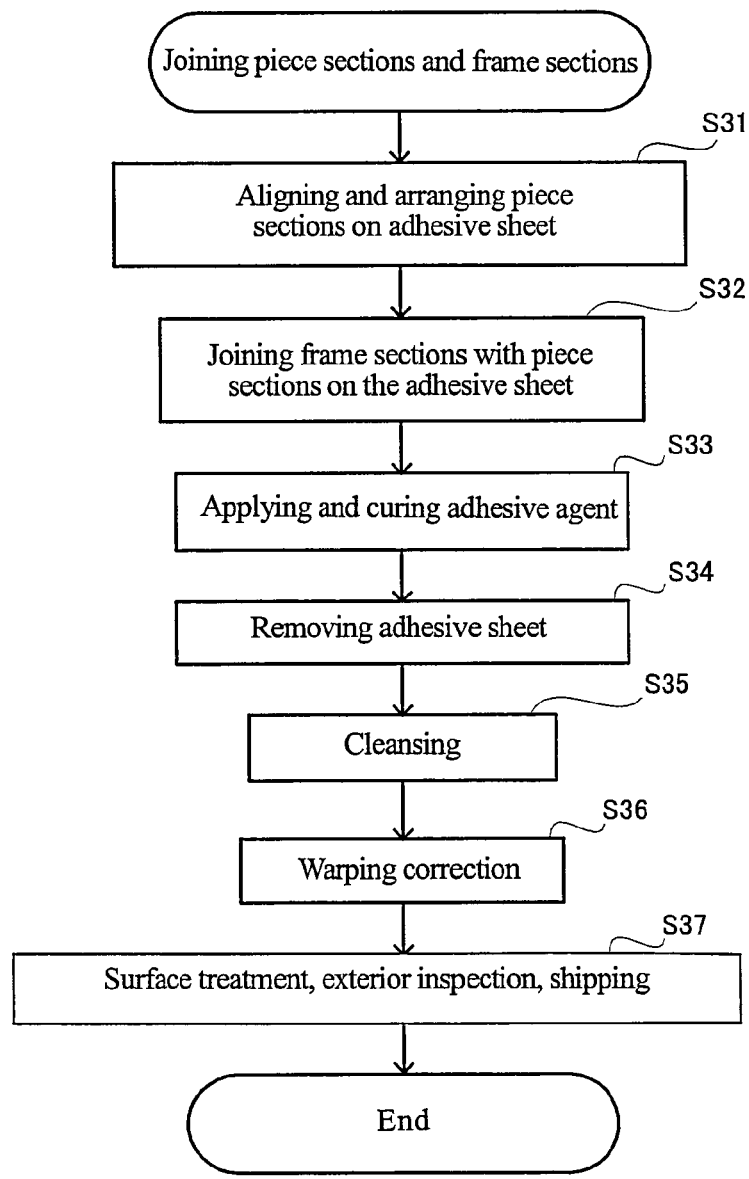
FIG. 17 is a flowchart showing a method for manufacturing a multi-piece board, especially the steps to join piece sections and frame sections, according to the present embodiment.

In a method for manufacturing a multi-piece board according to the present embodiment, the procedures shown in FIG. 17 are conducted to join piece sections (12a-12d) (FIG. 1) and frame sections (11a, 11b) (FIG. 1).

Figure 18:
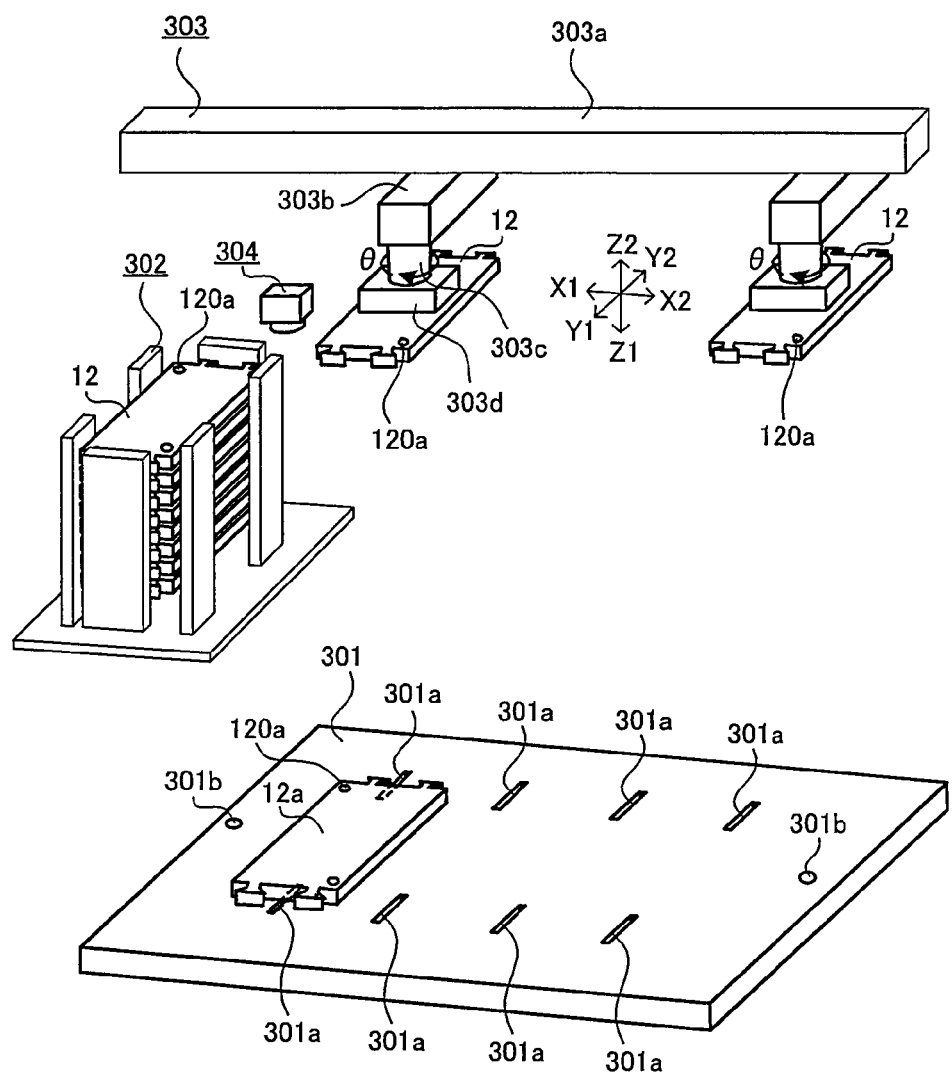
FIG. 18 is a view illustrating a step to align a piece section on a predetermined spot of an adhesive sheet.

After the procedures shown in FIG. 7, piece sections 12 are stored in a stocker 302 as shown in FIG. 18. In stocker 302, piece sections 12 are stored by stacking them. Then, in step (S31), a piece section 12 in stocker 302 is lifted using mounter 303 and the piece section 12 is arranged on a predetermined spot of adhesive sheet 301 (a board material having adhesiveness on its entire surface) after confirming the positions of alignment patterns (120a) (alignment marks) of piece section 12 using camera 304.

Here, mounter 303 has bar-type frame (303a) extended in directions X, expandable arm (303b) that expands/shrinks in directions Y, shaft (303c) that expands/shrinks in directions Z and rotates in direction θ, and suction pad (303d) that allows attachment/detachment of piece section 12. Expandable arm (303b) is connected to bar-type frame (303a) and moves horizontally along bar-type frame (303a) in directions X. Shaft (303c) is connected to expandable arm (303b) and has suction pad (303d) on its end. Therefore, as expandable arm (303b) moves horizontally and expands/shrinks while shaft (303c) expands/shrinks and rotates, the XYZ coordinates of suction pad (303d) and even its angles may be adjusted freely. Suction pad (303d) suction-grips piece section 12 using a vacuum chuck, for example.

Although not shown in the drawing, camera 304 has a movable structure substantially the same as that of mounter 303 and moves horizontally in directions (X, Y).

When positioning piece section 12 on adhesive sheet 301, first, suction pad (303d) suction-grips piece section 12. Then, mounter 303 lifts piece section 12 in direction-Z2 and brings piece section 12 to a spot where camera 304 can recognize alignment patterns (120a) of piece section 12. Camera 304 shifts its position in directions X or directions Y according to requirements so that it can read the positioning data of alignment patterns (120a). Such positioning data are transmitted to a computer which prepares an order to mounter 303 according to the positioning data. Then, mounter 303 receives the order and arranges piece section 12 on a predetermined spot of adhesive sheet 301. Accordingly, piece sections (12a-12d) are arranged one by one on adhesive sheet 301 to be positioned as shown in FIG. 1.

Adhesive sheet 301 is adhesive. Thus, piece sections (12a-12d) placed on adhesive sheet 301 are provisionally fixed by such adhesiveness. Also, in adhesive sheet 301, two through-holes (301a), having a shape elongated in directions Y, are formed in an area corresponding to each of piece sections (12a-12d). Therefore, piece sections (12a-12d) are each arranged on two through-holes (301a). In doing so, substantially half (half a hole in the longitudinal direction) of each through-hole (301a) is covered by piece sections (12a-12d). In addition, adhesive sheet 301 has base holes (301b).

Figure 19:
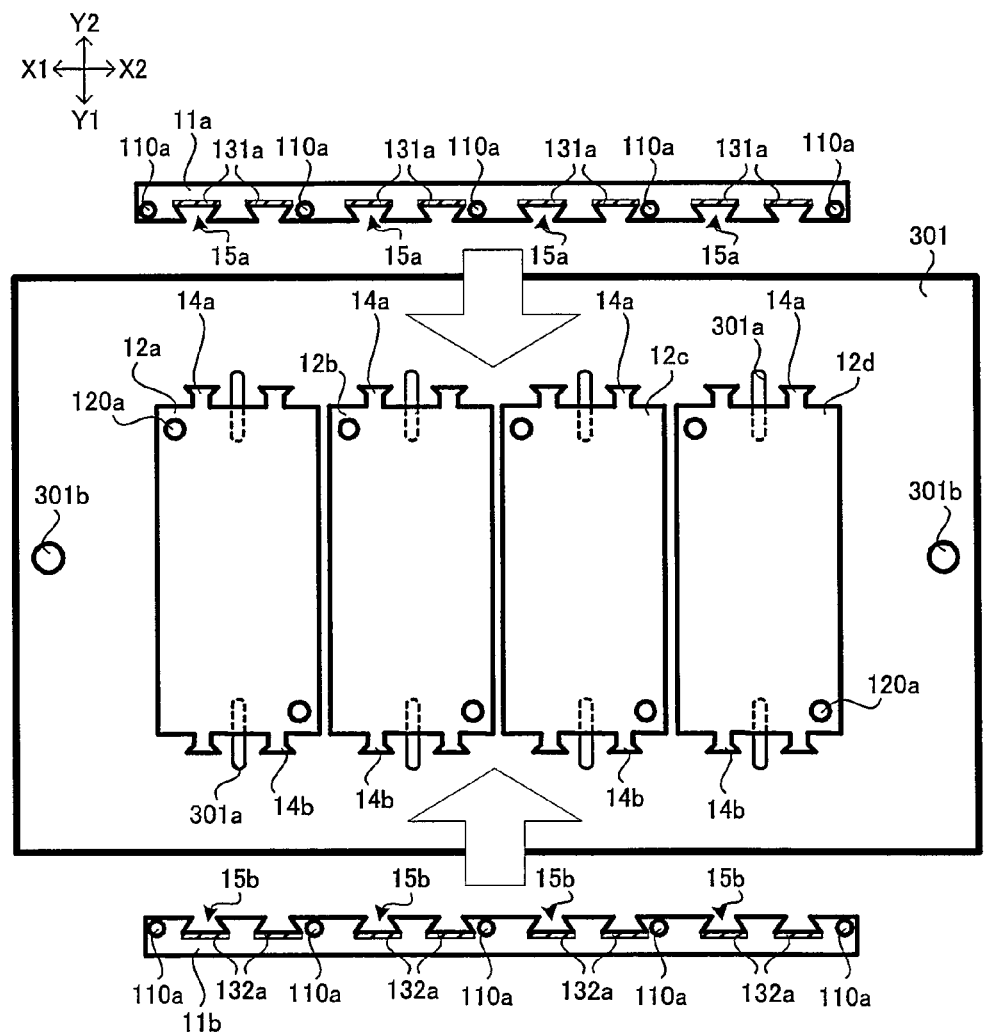
FIG. 19 is a view illustrating a step to position frame sections in such a way that the frame sections face piece sections by means of notch portions.
Figure 20:
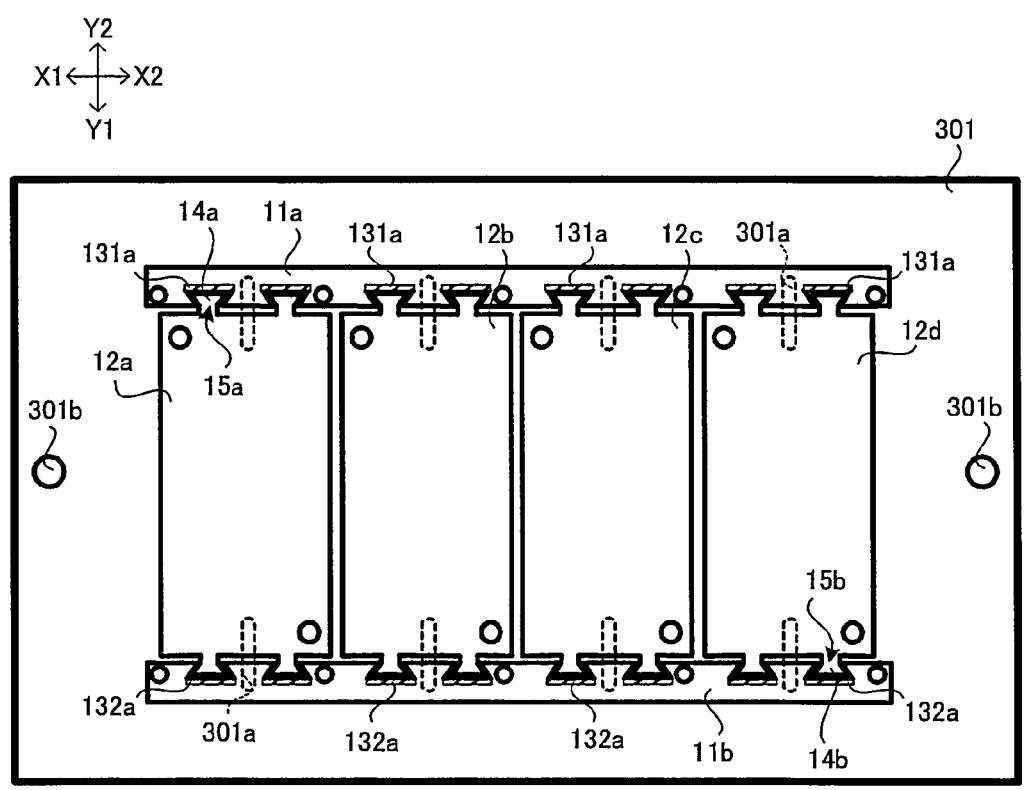
FIG. 20 is a view showing piece sections and frame sections aligned to face each other by means of notch portions.
Figure 21:
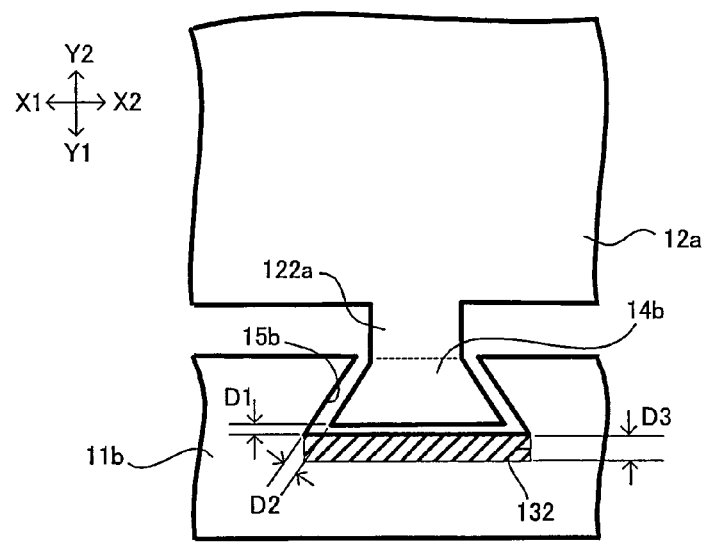
FIG. 21 is a magnified view showing part of FIG. 20.
Figure 22:
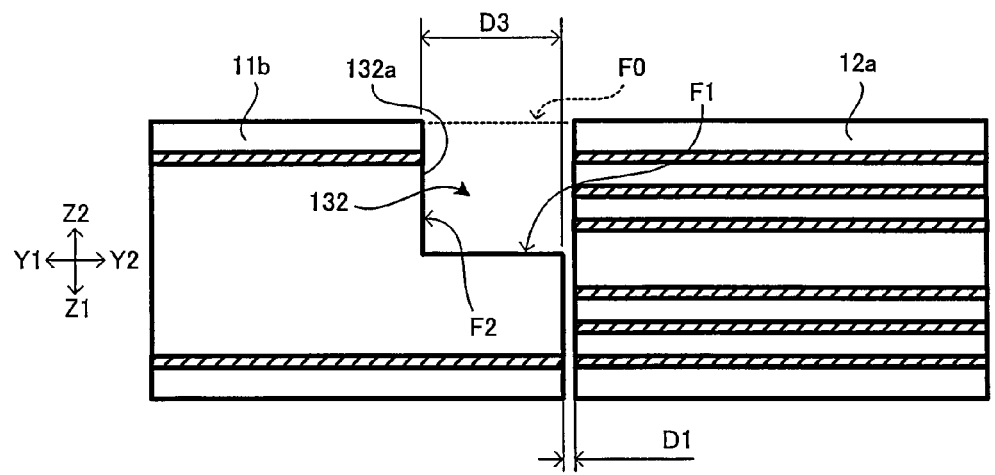
FIG. 22 is a cross-sectional view of FIG. 21.

Next, in step (S32) of FIG. 17, frame sections (11a, 11b) are joined to piece sections (12a-12d) by hand, as shown in FIG. 19. Accordingly, as shown in FIG. 20, each through-hole (301a) is set under one of piece sections (12-12d) and frame section (11a) or (11b) to be completely covered. Joint portion (15b) of frame section (11b) and joint portion (14b) of piece section (12a) are arranged with predetermined clearances (D1, D2) (see FIG. 2), as shown in FIG. 21 (partially magnified view of FIG. 20) and FIG. 22 (cross-sectional view of FIG. 21). Receptor 132 (cavity) is formed between frame section (11b) and piece section (12a) in order to have adhesive agent 16 injected. The configuration of receptor 132 and the values of clearances (D1, D2) and of width (D3) of notch portion (132a) are as described previously.

Figure 23:
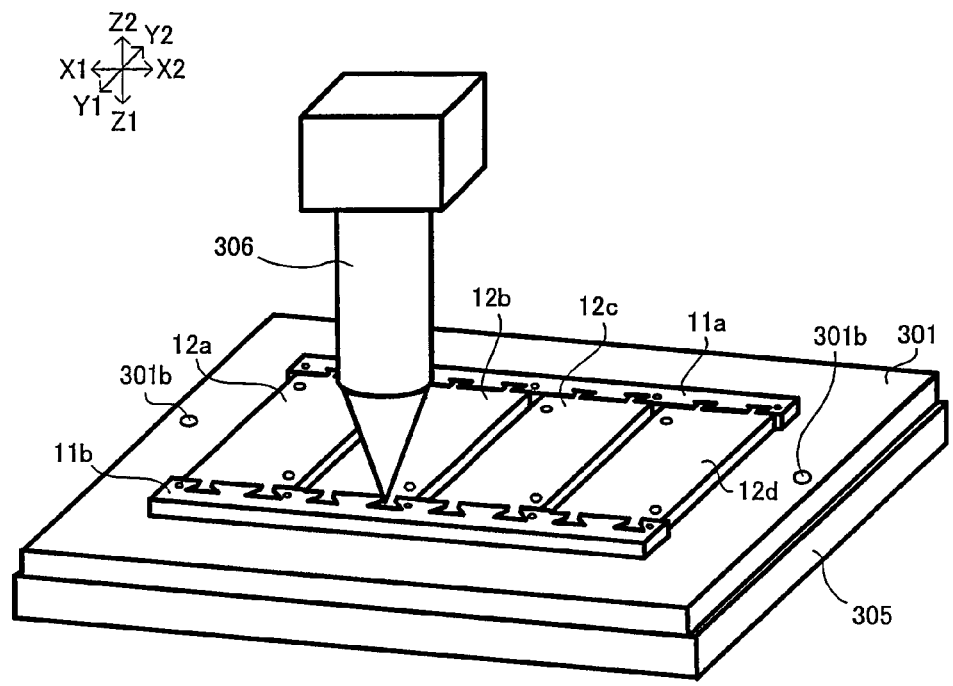
FIG. 23 is a view illustrating a step to apply an adhesive agent in a clearance between a piece section and a frame section.
Figure 24:
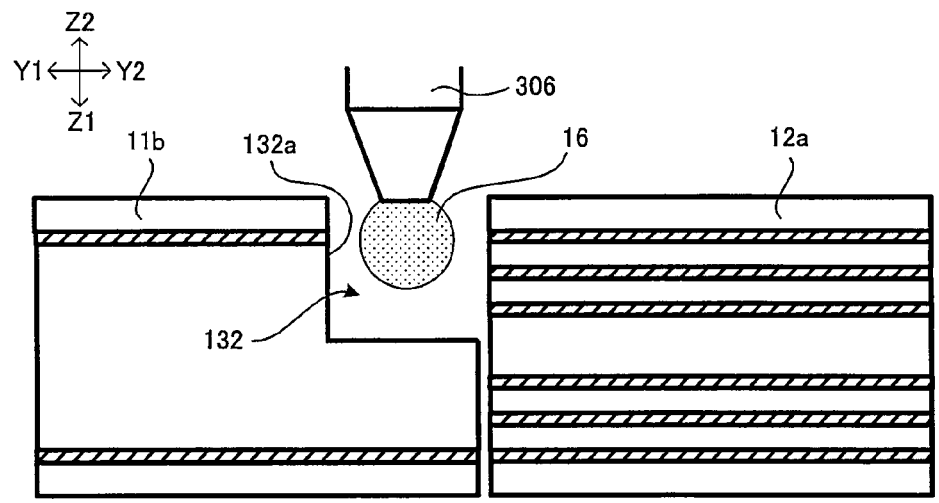
FIG. 24 is a cross-sectional view showing part of FIG. 23.

Next, in step (S33) of FIG. 17, adhesive sheet 301 is set on stand 305, as shown in FIGS. 23 and 24 (partial cross-sectional view of FIG. 23), and adhesive agent 16 made of UV-curable resin is applied, for example, into the clearances between piece sections (12a-12d) and frame sections (11a, 11*b*) using dispenser 306. Pins (omitted from the drawings) of stand 305 are inserted into base holes (301*b*) of adhesive sheet 301 for alignment.

Here, although omitted from the drawings, dispenser 306 has substantially the same movable structure as that of mounter 303, and is movable horizontally along directions X and Y, as well as vertically along directions Z. Using such dispenser 306, adhesive agent 16 may be applied at any spots on adhesive sheet 301. In the present embodiment, adhesive agent 16 is injected into receptor 132 by dispenser 306.

By injecting adhesive agent 16 into receptor 132, as shown in FIG. 2 previously, adhesive agent 16 flows into other clearances and fills each clearance. After that, adhesive agent 16 is cured by spot-beaming ultraviolet rays, for example. By filling and curing adhesive agent 16 between piece sections (12*a*-12*d*) and frame sections (11*a*, 11*b*), piece sections (12*a*-12*d*) and frame sections (11*a*, 11*b*) are joined and fixed (adhered). Accordingly, piece sections (12*a*-12*d*) and frame sections (11*a*, 11*b*) are integrated and multi-piece board 10 is completed as shown in FIG. 1 earlier.

A UV-curable adhesive agent used in the present invention is a non-thermosetting adhesive agent and does not require a thermal treatment to be cured. Thus, by using a UV-curable adhesive agent, the shape of a board may be suppressed from transformation caused by temperature change (such as shrinkage after being cured). Photocurable adhesive agents are usually non-thermosetting adhesives. Thus, photocurable adhesive agents other than UV-curable adhesive agents may also be used as adhesive agent 16. In addition, acrylic adhesives curable by energy irradiation or two-pack type acrylic adhesives may also be effective. Since acrylic adhesive agents are also non-thermosetting adhesives and do not require thermal treatments, by using acrylic adhesive agents, the shape of a substrate may be suppressed from transformation (such as shrinkage after being cured). Photocurable adhesive agents indicate adhesives curable by irradiation of predetermined electromagnetic waves (including UV or the like) which are not limited to visible light.

Figure 25:
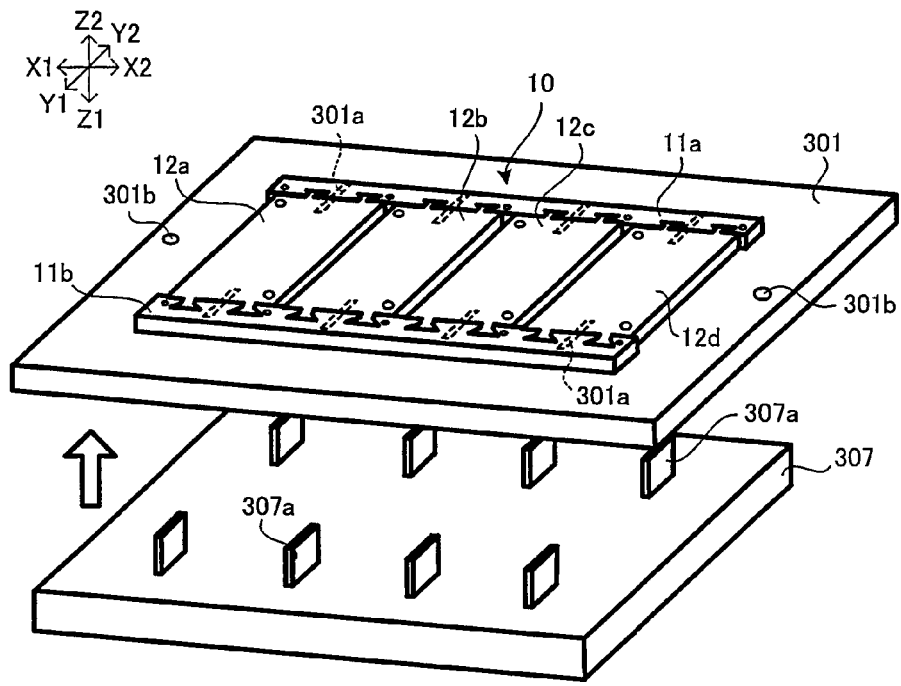
FIG. 25 is a view illustrating a step to remove an adhesive sheet from a multi-piece board.

Next, in step (S34) of FIG. 17, adhesive sheet 301 is removed from multi-piece board 10 using device 307, for example, as shown in FIG. 25.

Figure 26:
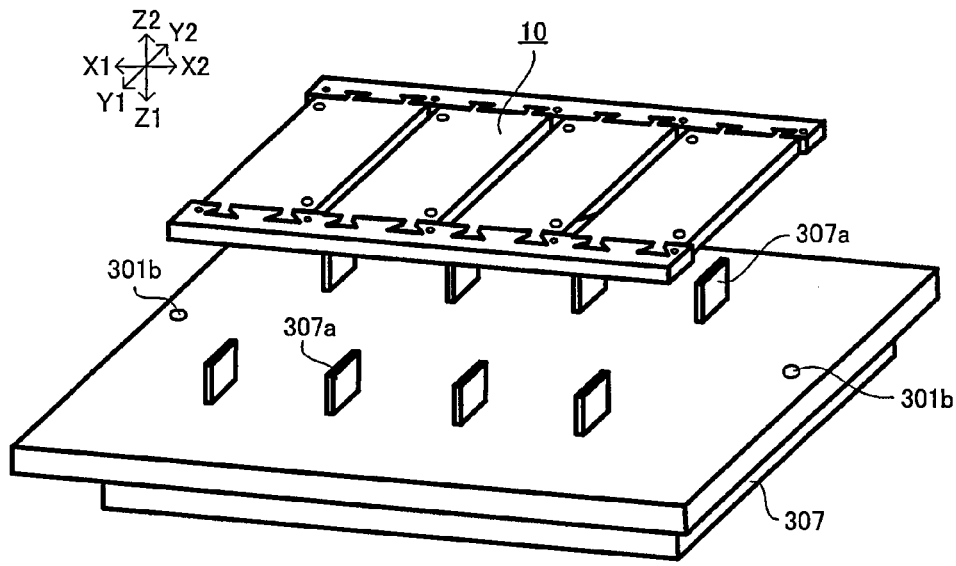
FIG. 26 is a view showing a state in which the multi-piece board and the adhesive sheet are separated.

Here, device 307 has protruding portions (307*a*) (protruding posts) which protrude in directions Z (specifically, toward the arrow-Z2 side in the drawing). The number and the planar shape of protruding portions (307*a*) correspond to the number and the planar shape of through-holes (301*a*). Namely, protruding portions (307*a*) are elongated in directions Y, the same as through-holes (301*a*). However, since each protruding portion (307*a*) is made one size smaller than through-hole (301*a*), each protruding portion (307*a*) may be inserted into through-hole (301*a*). By inserting protruding portions (307*a*) into through-holes (301*a*), the lower surface (the surface on the arrow-Z1 side) of multi-piece board 10 is pressed against the tips (especially the top surfaces) of protruding portions (307*a*). In doing so, as shown in FIG. 26, multi-piece board 10 on adhesive sheet 301 is pushed out, and multi-piece board 10 and adhesive sheet 301 will be separated. Adhesive sheet 301 may be reusable about 1,000 times, for example.

Next, in step (S35) of FIG. 17, multi-piece board 10 is cleaned.

Then, in step (S36) of FIG. 17, warping in multi-piece board 10 is corrected by a reflow, for example.

After that, in step (S17) of FIG. 17, surface treatments and exterior inspections are conducted and multi-piece boards 10 are shipped as finished products.

According to the above procedures, only acceptable pieces are selected to manufacture multi-piece board 10. If a defective piece is found in a multi-piece board, the board may be restored by separating only the defective piece by shirring, for example, and replacing it with a good piece. By such a restoration procedure, when part of multi-piece board 10 becomes defective, it is not necessary to discard the entire board and thus good pieces will not be wasted. Therefore, productivity and unit yields may be enhanced.

The manufacturing method of the present embodiment is effective to enhance productivity and reduce costs. A rough estimate shows that by employing the manufacturing method of the present embodiment, the costs for bonding piece sections (12*a*-12*d*) and frame sections (11*a*, 11*b*) increase by 5%; however, unit yields increase by 13%, and waste of good pieces decreases 2% by replacing defective pieces with good ones. Overall, a cost reduction of 10% is achieved.

In the manufacturing method of the present embodiment, the pieces are provisionally fixed onto adhesive sheet 301, and tape or the like for provisional adhesion is not required. Therefore, a step to fix the pieces with tape is not required, either. Accordingly, manufacturing costs may be reduced.

In the manufacturing method of the present embodiment, alignment marks of piece sections (12*a*-12*d*) are recognized by camera 304 to align piece sections (12*a*-12*d*). Accordingly, without using devices with pins, piece sections (12*a*-12*d*) may be positioned with high accuracy.

In the manufacturing method of the present embodiment, since an independent piece section (piece section 12) is bonded to frame sections (11*a*, 11*b*), the number of piece sections to be joined (four piece sections (12*a*-12*d*) in the present embodiment) may be determined freely.

In the manufacturing method of the present embodiment, piece sections (12*a*-12*d*) and frame sections (11*a*, 11*b*) are adhered to each other using adhesive agent 16. Therefore, adhesiveness is strong between frame sections (11*a*, 11*b*) and good piece sections. Also, since frame sections (11*a*, 11*b*) and good pieces are securely fixed to each other after alignment, their positions after being adhered show high accuracy.

In the manufacturing method of the present embodiment, adhesive agent 16 is injected into receptor 132. By doing so, adhesive agent 16 is securely filled into clearances between piece sections (12*a*-12*d*) and frame sections (11*a*, 11*b*). Accordingly, strong connections are achieved between piece sections (12*a*-12*d*) and frame sections (11*a*, 11*b*). As a result, piece sections (12*a*-12*d*) are suppressed from detaching, making them easier to handle.

So far, a multi-piece board and its manufacturing method according to an embodiment of the present invention have been described. However, the present invention is not limited to such.

Figure 27:
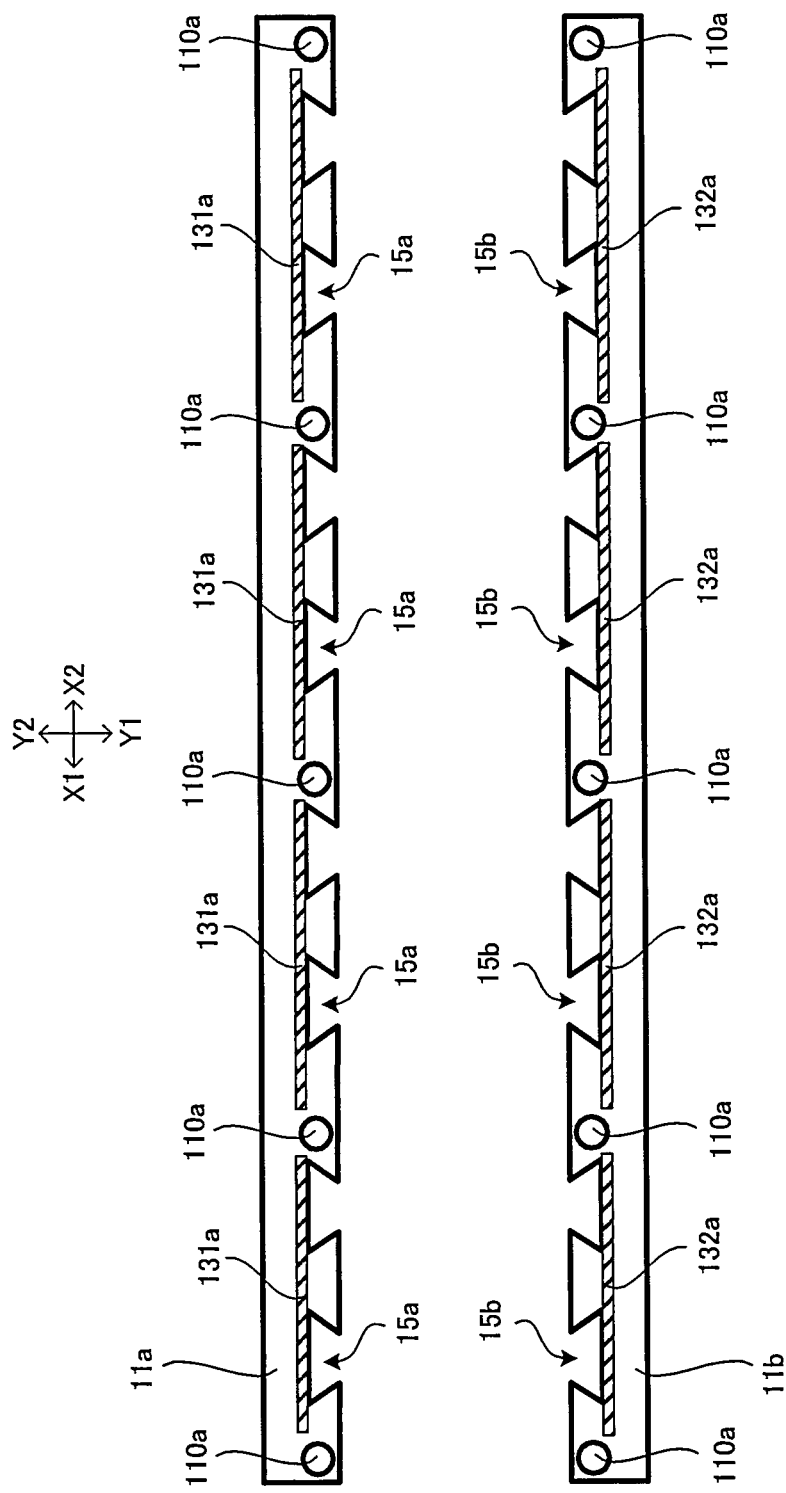
FIG. 27 is a view showing a first modified example of the planar structure of notch portions.
Figure 28:
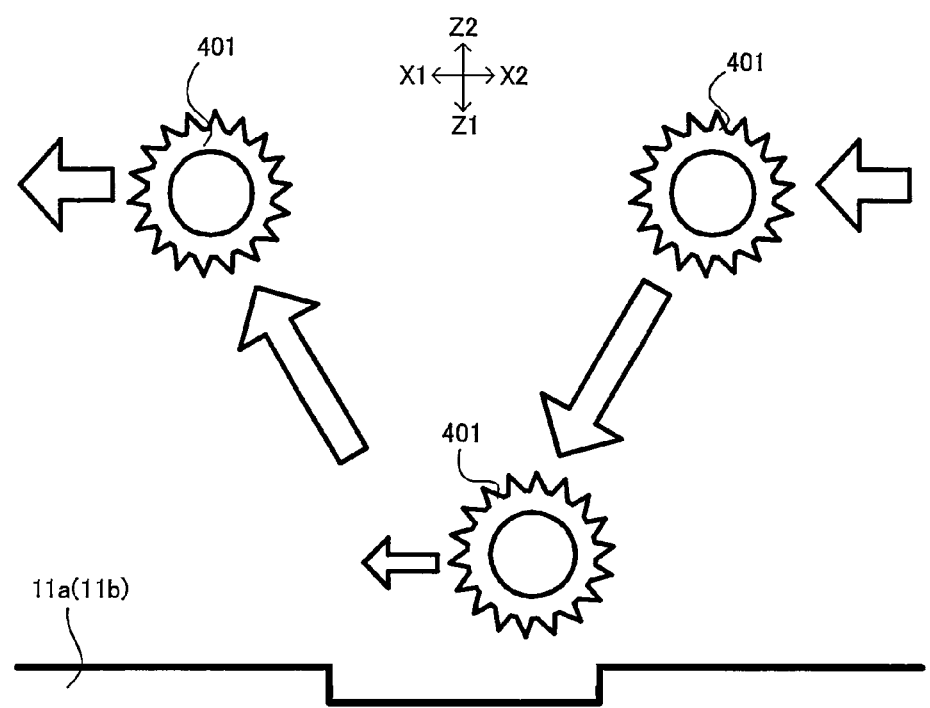
FIG. 28 is a view illustrating a preferred method for forming notch portions shown in FIG. 27.

Notch portions (131*a*) or (132*a*) are not limited to those formed to correspond to joint portions (15*a*) or (15*b*) (FIG. 3). For example, as shown in FIG. 27, notch portions (131*a*) or (132*a*) may be formed linearly from one end to the other end of frame section (11*a*) or (11*b*) except for the portions where holes (110*a*) are positioned along such a line. In such a case, as shown in FIG. 28, for example, frame section (11*a*) or (11*b*) is preferred to be processed intermittently from one end to the other end by moving V-groove cutting tool 401 from one end of frame section (11*a*) or (11*b*) toward the other end while jumping V-groove cutting tool 401 to skip the portions where holes (110*a*) are positioned.

Figure 29:
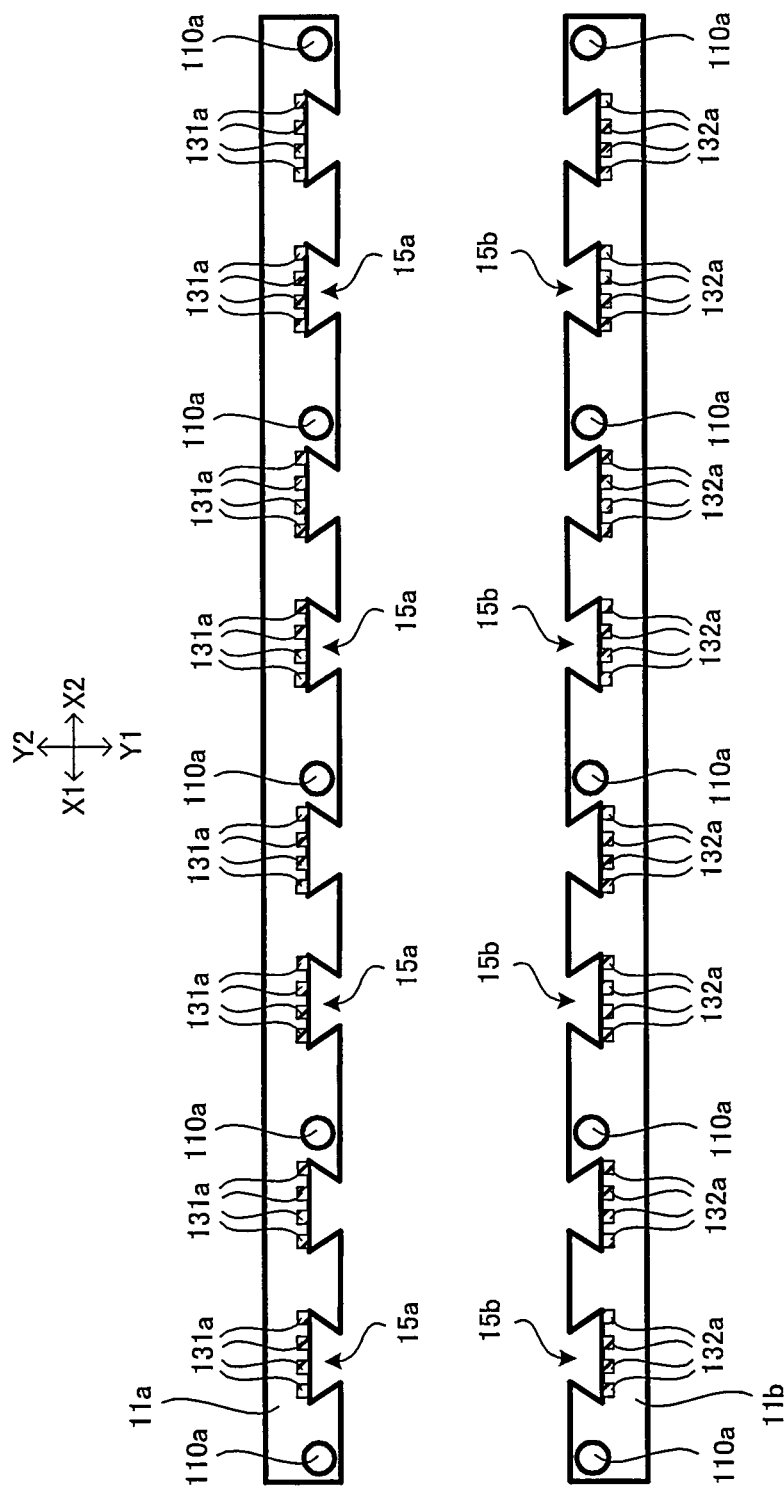
FIG. 29 is a view showing a second modified example of the planar structure of notch portions.

Also, receptors 131 or 132 (cavities) are not limited to grooves. For example, as shown in FIG. 29, they may be a series of multiple small holes. Such small holes are preferred to be formed using a router bit, drill or laser, for example.

Figure 30:
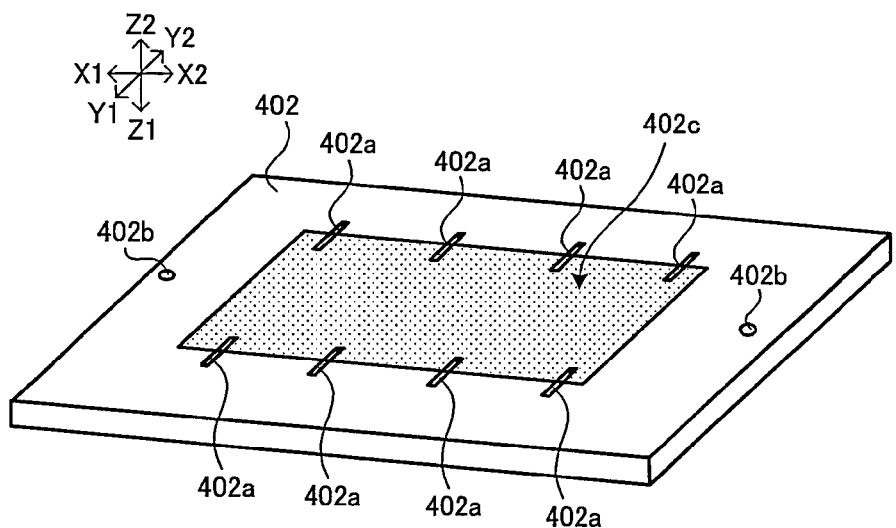
FIG. 30 is a perspective view illustrating a first modified example of a method for provisionally fixing piece sections.
Figure 31:
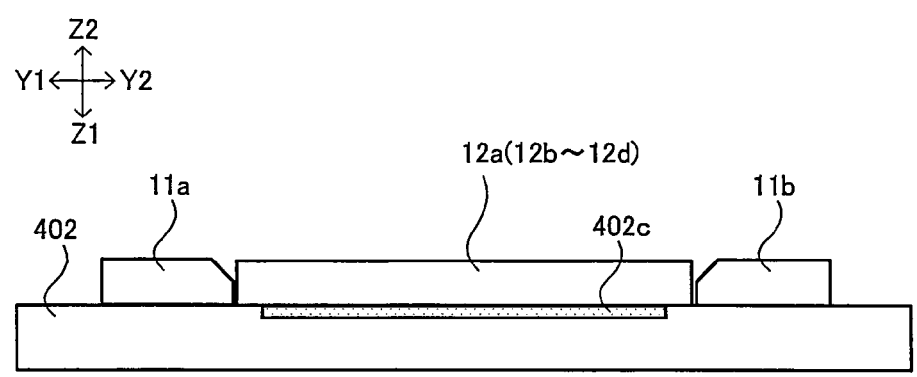
FIG. 31 is a cross-sectional view illustrating a first modified example of a method for provisionally fixing piece sections.

Instead of adhesive sheet 301, stand 402 with adhesive section (402*c*) (a partially adhesive board material) may be used as shown in FIG. 30, for example. Part of stand 402 where adhesive section (402c) is located is adhesive. As shown in FIG. 31, for example, adhesive section (402c) is positioned under piece sections (12a-12d) (on the arrow-Z1 side), but not positioned under frame sections (11a, 11b). Accordingly, using stand 402, only piece sections (12a-12d) may be provisionally fixed onto adhesive section (402c). Stand 402 of such an example has through-holes (402a) and base holes (402b) the same as adhesive sheet 301.

A method for provisionally fixing piece sections (12a-12d) is not limited to such a method using adhesive sheet 301. Piece sections (12a-12d) may be provisionally fixed using any other method. For example, instead of adhesive sheet 301, vacuum chucks, electrostatic chucks, magnetic sheets or the like may also be used for provisionally fixing the piece sections through suction power, electrostatic power or magnetic power. However, if magnetic power is used for fixing piece sections provisionally, piece sections (12a-12d) are required to be magnetic.

In the above embodiment, after piece sections (12a-12d) are aligned and positioned, frame sections (11a, 11b) are arranged. However, prior to positioning piece sections (12a-12d), frame sections (11a, 11b) may be aligned and positioned. In the following, with reference to the drawings, an example is described where frame sections (11a, 11b) are aligned using devices (stand 403, separator 404) prior to positioning piece sections (12a-12d).

Figure 32:
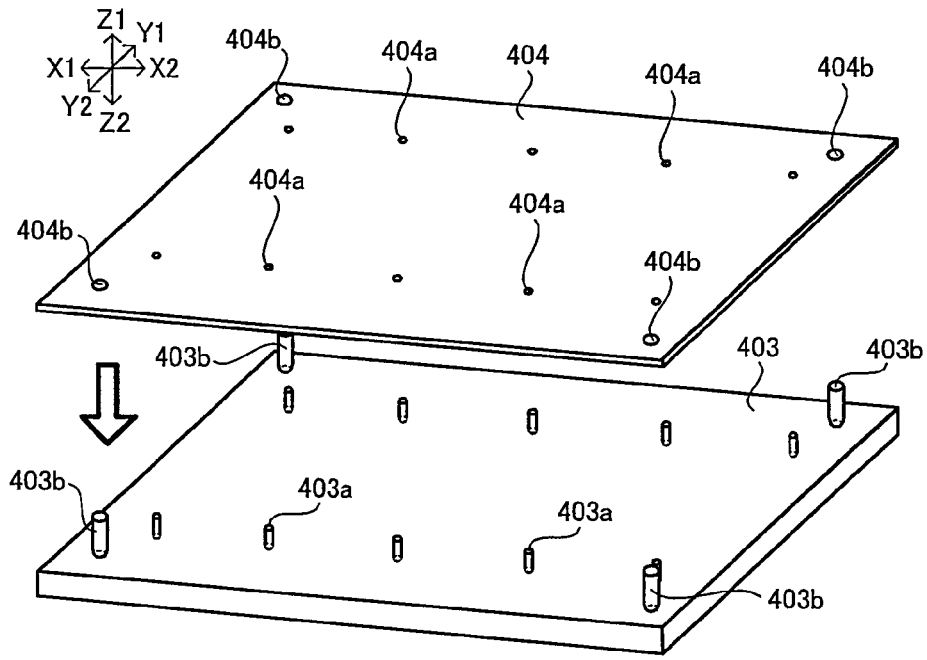
FIG. 32 is a view illustrating a first step of an example of a method for aligning frame sections.

First, as shown in FIG. 32, stand 403 and separator 404 are prepared. Stand 403 has pins (403a) to be inserted into holes (110a) (FIG. 6) of frame sections (11a, 11b) in areas where frame sections (11a, 11b) will be positioned. Stand 403 also has pins (403b) at its four corners. In the meantime, separator 404 has holes (404a) in spots corresponding to pins (403a), and holes (404b) in spots corresponding to pins (403b). By inserting pins (403a, 403b) into holes (404a, 404b), separator 404 is installed onto stand 403 by hand, for example.

Figure 33:
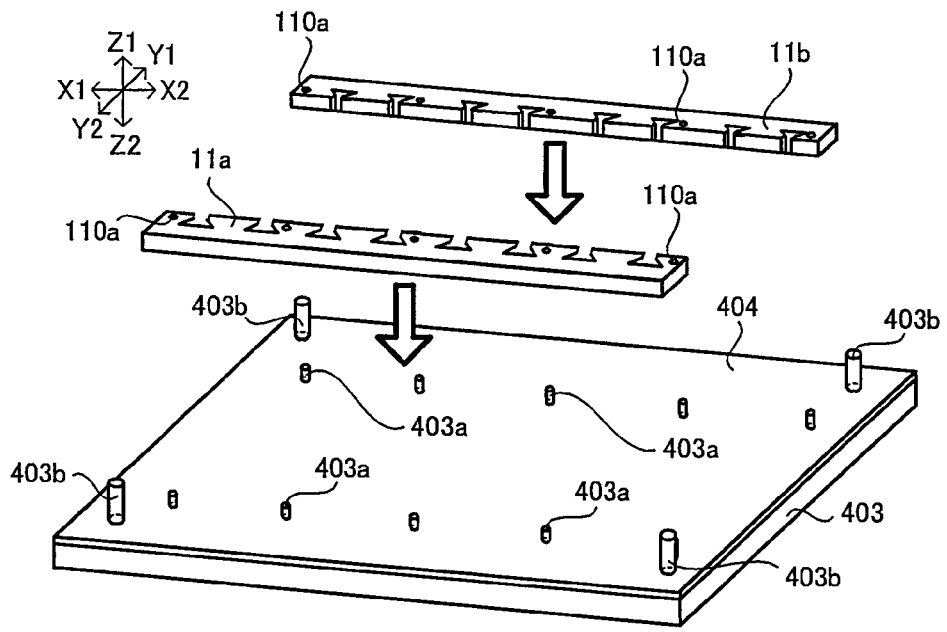
FIG. 33 is a view illustrating a second step of an example of a method for aligning frame sections.

Next, as shown in FIG. 33, by hand, for example, frame sections (11a, 11b) are arranged on separator 404. During that time, pins (403a) protruding from separator 404 are inserted into holes (110a) of frame sections (11a, 11b). Pins (403a) will not protrude from holes (110a).

Figure 34:
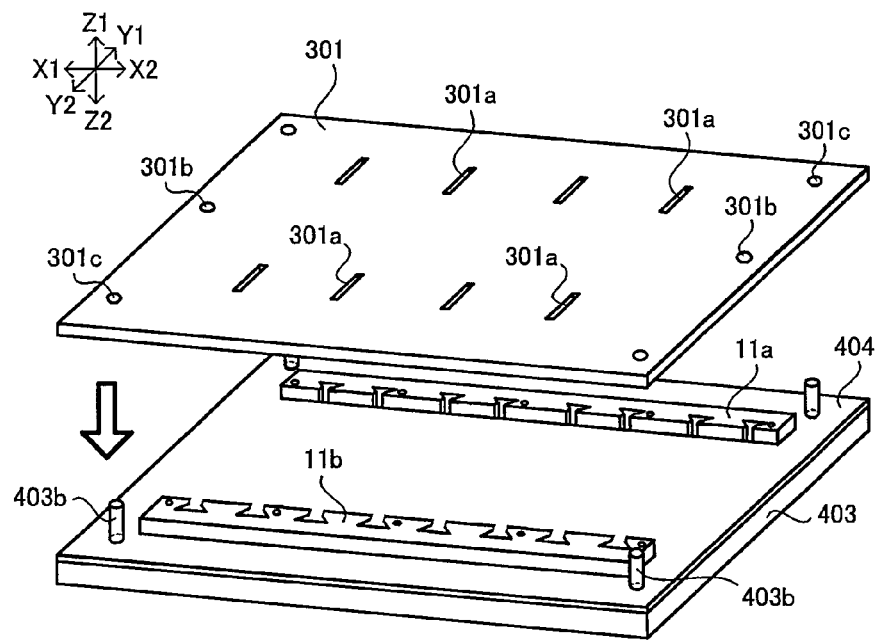
FIG. 34 is a view illustrating a third step of an example of a method for aligning frame sections.

Then, as shown in FIG. 34, by hand, for example, adhesive sheet 301 having holes (301c) is mounted at its four corners onto frame sections (11a, 11b), then, by pressing appropriately, frame sections (11a, 11b) are adhered to adhesive sheet 301. During that time, pins (403b) protruding from separator 404 are inserted into holes (301c) of adhesive sheet 301.

Figure 35:
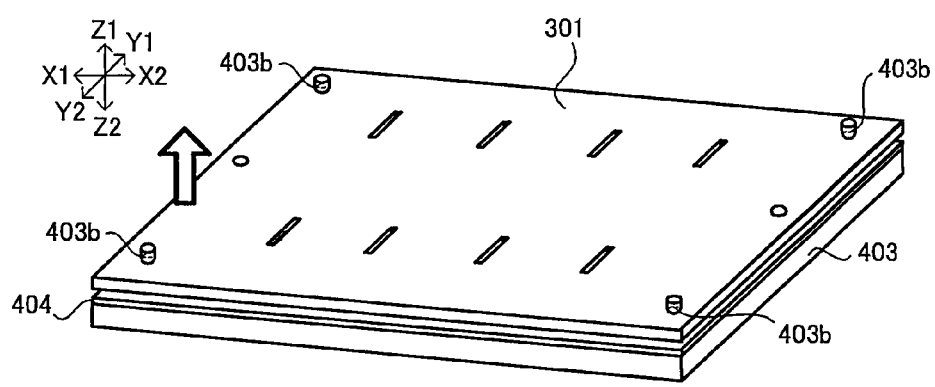
FIG. 35 is a view illustrating a fourth step of an example of a method for aligning frame sections.
Figure 36:
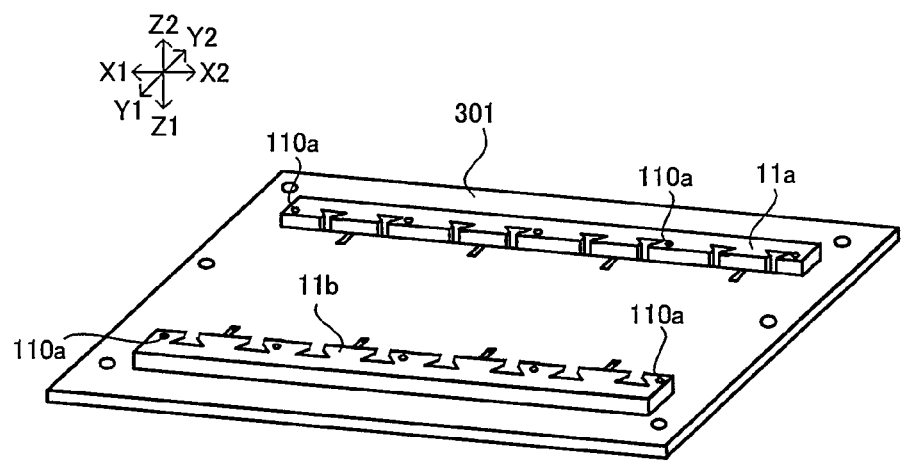
FIG. 36 is a view showing the frame sections aligned by an example of a method for aligning frame sections and positioned on an adhesive sheet.

Then, as shown in FIG. 35, by hand, for example, adhesive sheet 301 is removed from the devices (stand 403, separator 404). By doing so, as shown in FIG. 36, frame sections (11a, 11b) are provisionally fixed to predetermined positions on adhesive sheet 301.

According to a method using such devices, frame sections (11a, 11b) may be easily aligned by hand. Piece sections (12a-12d) may also be aligned using the same devices. However, for alignment with high accuracy, it is preferred that frame sections (11a, 11b) and piece sections (12a-12d) be aligned using automatic alignment equipment (see FIG. 18) with camera 304, mounter 304 or the like.

Figure 37:
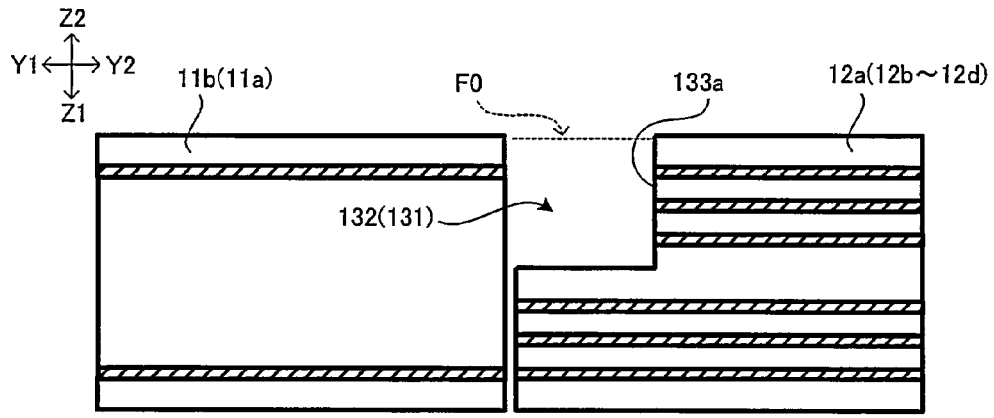
FIG. 37 is a view showing a third modified example of the cross-sectional shape of a receptor.
Figure 38:
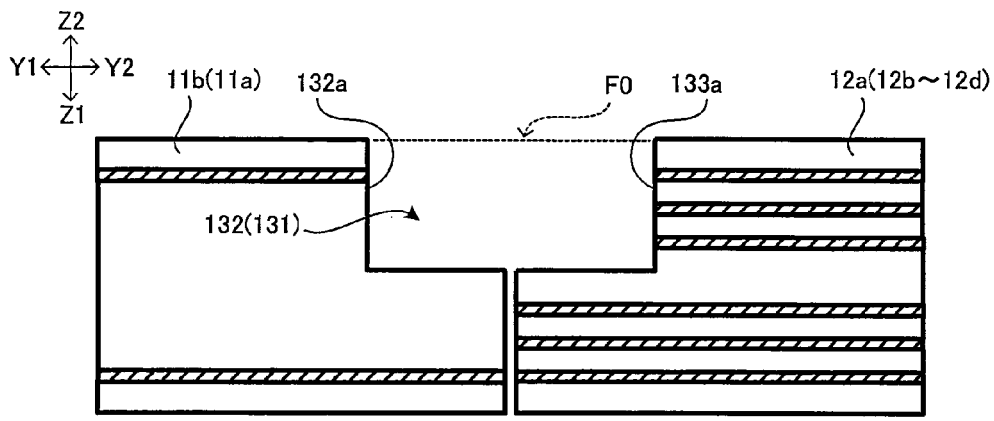
FIG. 38 is a view showing a fourth modified example of the cross-sectional shape of a receptor.
Figure 39:
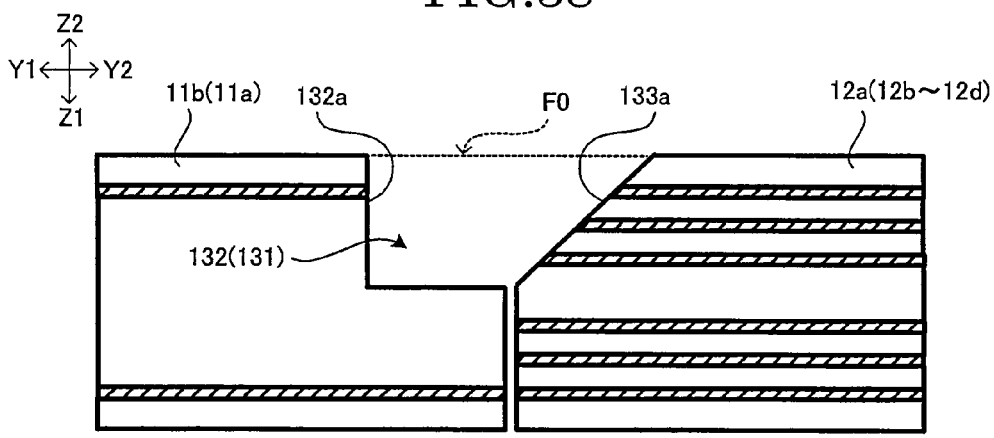
FIG. 39 is a view showing a fifth modified example of the cross-sectional shape of a receptor.

In the above embodiment, notch portions (131a, 132a) are formed in frame sections (11a, 11b). However, the present invention is not limited to such. For example, as shown in FIG. 37 (a view corresponding to FIG. 3), notch portions (133a) may be formed in piece sections (12a-12d). Also, as shown in FIG. 38 (a view corresponding to FIG. 3), notch portions (131a, 132a, 133a) may be formed both in frame sections (11a, 11b) and piece sections (12a-12d). FIG. 38 shows an example in which notch portions (131a, 132a) of frame sections (11a, 11b) have the same structure as notch portions (133a) of piece sections (12a-12d). However, as shown in FIG. 39 (a view corresponding to FIG. 3), notch portions (131a, 132a) and notch portion (133a) may be configured differently from each other. However, to reduce costs, instead of forming notch portions both in frame sections (11a, 11b) and piece sections (12a-12d), it is effective to form notch portions only in one of them. Especially since frame sections (11a, 11b) are usually discarded in the final stage, it is preferred that notch portions be formed in frame sections (11a, 11b).

The number of joint portions (14a, 14b) (protruding portions) and joint portions (15a, 15b) (cavities) is not limited specifically. As the number of joint portions (14a, 14b) and joint portions (15a, 15b) increases, the joint strength becomes stronger between frame sections (11a, 11b) and piece sections (12a-12d). However, the manufacturing process becomes more difficult.

Figure 40:
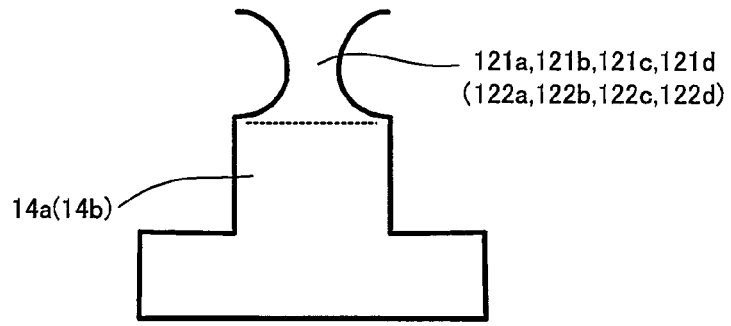
FIG. 40 is a view showing a first modified example of a planar shape of a joint portion.
Figure 41:
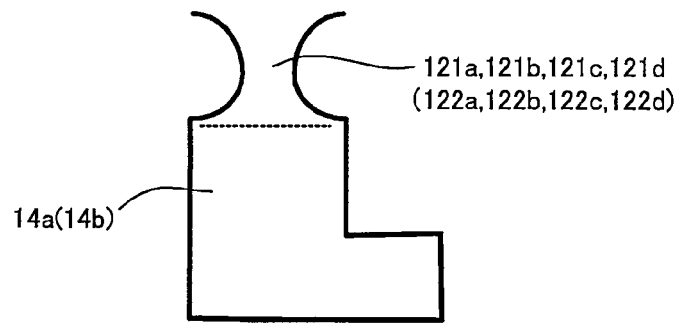
FIG. 41 is a view showing a second modified example of a planar shape of a joint portion.
Figure 42:
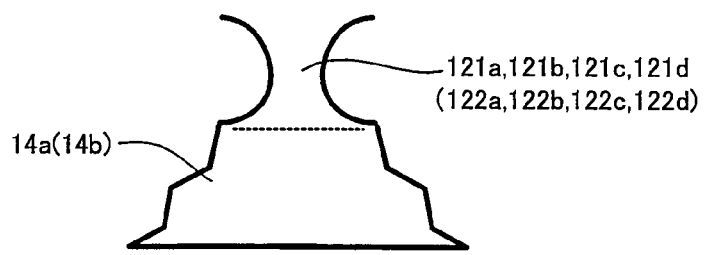
FIG. 42 is a view showing a third modified example of a planar shape of a joint portion.

The planar shapes of joint portions (14a, 14b) (protruding portions) and joint portions (15a, 15b) (cavities) are not limited to trapezoidal. For example, as shown in FIG. 40 or 41, joint portions (14a, 14b) may be T-shaped or L-shaped. Also, as shown in FIG. 42, to increase the contact areas with joint portions (15a, 15b), the sides of joint portions (14a, 14b) may be set zigzag, for example. Usually, having joint portions (15a, 15b) formed to correspond to the shape of joint portions (14a, 14b) is effective in strengthening their bonding. However, they may be configured differently. Basically, any configurations may be employed for joint portions (14a, 14b) and joint portions (15a, 15b). However, they are preferred to be shaped in such a way that when piece sections (12a-12d) are pulled in a direction parallel to the main surfaces of the board (X-Y plane), joint portions (14a, 14b) will be latched by frame sections (11a, 11b) so that piece sections (12a-12d) will not be detached from frame sections (11a, 11b). However, according to requirements, their configurations may be selected freely, such as rectangular or circular to make them simpler.

Joint portions (14a, 14b) (protruding portions) may be formed in frame sections (11a, 11b), and joint portions (15a, 15b) (cavities) may be formed in piece sections (12a-12d).

Adhesive agents other than photocurable adhesives or acrylic adhesives may also be used. For example, thermosetting adhesives may be used. However, if thermosetting adhesives are used, adhesion strength is high, but concerns may arise such as transformation of a board caused by temperature change.

Two or more types of adhesive agents may be used. For example, after adhering with a non-thermosetting adhesive such as a photocurable adhesive or acrylic adhesive, a thermosetting adhesive may be used to reinforce the adhesion.

To simplify the manufacturing procedures, the above embodiment showed multi-piece board 10 with piece sections (12a-12d) having the same structure. However, the present invention is not limited to such. For example, the present invention may be employed even if piece sections (12a-12d) have different structures. In such a case, piece sections (12a-12d) may be manufactured using different panels.

The order of steps in the above embodiment is not limited to those shown in the flowcharts. Such steps may be modified in a scope that does not deviate from the gist of the present invention. In addition, unnecessary steps may be omitted according to requirements.

A method for manufacturing a multi-piece board having a frame section and multiple piece sections connected to the frame section includes the following: forming the frame section in a manufacturing panel different from that for the piece sections; sorting out good pieces by inspecting the quality of the piece sections; forming notch portions in the end portions of at least either the frame section or the piece sections; arranging and provisionally fixing the frame section and the piece sections so as to face each other by means of the notch portions; injecting an adhesive agent into cavities formed by the notch portions when the frame section and the piece sections are provisionally fixed to each other; and joining the piece sections with the frame section by curing the adhesive agent injected into the cavities.

In a multi-piece board having a frame section and multiple piece sections connected to the frame section, notch portions are formed at end portions of at least either the frame section or the piece sections; the frame section and the piece sections are arranged to face each other by means of the notch portions; and the frame section and the piece sections are connected to each other by filling an adhesive agent in a first clearance between the frame section and the piece section where the notch portions are not formed, as well as in a second clearance which is enlarged by the notch portions, and by curing the adhesive agent.

In the above embodiment, quality, size, the number of layers and other factors of each layer may be modified freely. For example, frame sections (11a, 11b) may be made of metal such as aluminum.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a multi-piece board, comprising:
    forming a frame section to which a plurality of piece sections are joined;
    forming a plurality of notch portions on at least one of a surface of the frame section and surfaces of the piece sections such that the notch portions are positioned to form a plurality of cavities connected to clearances which are formed when the plurality of piece sections is provisionally fixed with respect to the frame section;
    provisionally fixing the piece sections and the frame section in respective positions such that the clearances extend along an entire thickness of the frame section in a thickness direction of the frame section and separate the frame section from the plurality of piece sections provisionally fixed with respect to the frame section and that the notch portions form the cavities connected to the clearances formed between the frame section and the piece sections, respectively;
    injecting an adhesive agent into the cavities formed by the notch portions and connected to the clearances formed between the frame section and the piece sections provisionally fixed to each other; and
    curing the adhesive agent such that the piece sections are joined to the frame section.

2. The method for manufacturing a multi-piece board according to claim 1, wherein the forming of the notch portions comprises forming the notch portions such that each of the cavities formed by each of the notch portions forms a groove.

3. The method for manufacturing a multi-piece board according to claim 2, wherein the groove has a width which is set in a range of 400 μm to 1 mm.

4. The method for manufacturing a multi-piece board according to claim 1, wherein each of the clearances formed between the frame section and the piece sections is at least 30 μm.

5. The method for manufacturing a multi-piece board according to claim 1, further comprising preparing a board having at least one adhesive portion, wherein the provisional fixing includes mounting the piece sections onto the board such that the piece sections are adhered to the board.

6. The method for manufacturing a multi-piece board according to claim 5, further comprising removing the board from the piece sections joined to the frame section after the curing, wherein the board has a plurality of penetrating holes penetrating through the board and formed in positions corresponding to the piece sections adhered on the board, the provisional fixing includes adhering the piece sections onto the board such that the piece sections are over the penetrating holes, and the removing of the board comprises inserting protruding portions formed on a removing device into the penetrating holes, respectively, from an opposite side of the board with respect to the piece sections such that the piece sections joined to the frame section are pushed out by the protruding portions.

7. The method for manufacturing a multi-piece board according to claim 1, further comprising:
    forming alignment marks in at least one of the frame section and the plurality of piece sections;
    recognizing the alignment marks with a camera; and
    aligning at least one of the frame section and the plurality of piece sections for the provisional fixing based on the alignment marks.

8. The method for manufacturing a multi-piece board according to claim 1, further comprising:
    forming a plurality of penetrating holes in the piece sections;
    preparing a board having a plurality of protruding portions which are positioned to be inserted into the penetrating holes formed in the piece sections; and
    inserting the protruding portions of the board into the penetrating holes of the piece sections prior to the provisional fixing such that the frame section and the piece sections are aligned for the provisional fixing on the board.

9. The method for manufacturing a multi-piece board according to claim 1, wherein the adhesive agent is a non-thermosetting adhesive agent.

10. The method for manufacturing a multi-piece board according to claim 1, wherein the notch portions are formed only at end portions of the frame section.

11. The method for manufacturing a multi-piece board according to claim 1, wherein the forming of the frame section comprises forming the frame section in a plurality from a frame section manufacturing panel.

12. The method for manufacturing a multi-piece board according to claim 1, further comprising inspecting quality of each of the piece sections such that the piece sections are sorted for acceptable piece sections.

13. The method for manufacturing a multi-piece board according to claim 1, further comprising inspecting quality of each of the piece sections such that the piece sections are sorted for acceptable piece sections, wherein the provisional fixing comprises provisionally fixing only the acceptable piece sections and the frame.

14. The method for manufacturing a multi-piece board according to claim 1, inspecting quality of each of the piece sections such that the piece sections are sorted for acceptable piece sections, wherein the forming of the frame section comprises forming the frame section in a plurality from a frame section manufacturing panel.

15. The method for manufacturing a multi-piece board according to claim 5, further comprising removing the board from the piece sections joined the frame section after the curing, wherein the board has a plurality of penetrating holes penetrating through the board and formed in positions corresponding to the piece sections adhered on the board, and the removing of the board comprises inserting protruding portions formed on a removing device into the penetrating holes, respectively, from an opposite side of the board with respect to the piece sections such that the piece sections joined to the frame section are pushed out by the protruding portions.

16. The method for manufacturing a multi-piece board according to claim 1, wherein the forming of the frame section comprises forming the frame section having a bar shape.

17. The method for manufacturing a multi-piece board according to claim 1, wherein the forming of the frame section comprises forming the frame section having a bar shape and a plurality of join portions with which a plurality of joint portions formed on the piece sections engages, respectively.

18. The method for manufacturing a multi-piece board according to claim 1, wherein the forming of the frame section comprises forming a plurality of join portions with which a plurality of joint portions formed on the piece sections engages, respectively.

19. The method for manufacturing a multi-piece board according to claim 1, wherein the forming of the frame section comprises forming a plurality of join portions with which a plurality of joint portions formed on the piece sections engages, respectively, such that the join portions of the frame section and the joint portions of the piece sections form the clearances and second clearances between the join portions of the frame section and the joint portions of the piece sections when engaged.

20. The method for manufacturing a multi-piece board according to claim 1, wherein the forming of the frame section comprises forming a plurality of join portions with which a plurality of joint portions formed on the piece sections engages, respectively, such that the join portions of the frame section and the joint portions of the piece sections form the clearances and second clearances having a greater width than the clearances between the join portions of the frame section and the joint portions of the piece sections when engaged.

* * * * *